(12) United States Patent
Takahashi et al.

(10) Patent No.: US 7,250,661 B2
(45) Date of Patent: Jul. 31, 2007

(54) SEMICONDUCTOR MEMORY DEVICE WITH PLURAL SOURCE/DRAIN REGIONS

(75) Inventors: Toshifumi Takahashi, Kawasaki (JP); Hidetaka Natsume, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 168 days.

(21) Appl. No.: 10/996,456

(22) Filed: Nov. 26, 2004

(65) Prior Publication Data
US 2005/0116303 A1 Jun. 2, 2005

(30) Foreign Application Priority Data
Nov. 27, 2003 (JP) .............................. 2003-397256

(51) Int. Cl.
*H01L 29/76* (2006.01)
*H01L 29/94* (2006.01)
(52) U.S. Cl. ...................... 257/371; 257/383; 257/384; 257/903
(58) Field of Classification Search ............ 257/66, 257/67, 69, 903, 904, 369, 371, 372, 382–384
See application file for complete search history.

(56) References Cited
U.S. PATENT DOCUMENTS
6,031,267 A * 2/2000 Lien ........................... 257/344
6,037,625 A * 3/2000 Matsubara et al. ......... 257/315
6,188,614 B1 * 2/2001 Hsu et al. .............. 365/185.33

FOREIGN PATENT DOCUMENTS
| JP | 2001-358232 | 12/2001 |
| JP | 2002-343890 | 11/2002 |
| JP | 2003-60088 | 2/2003 |

* cited by examiner

*Primary Examiner*—Hung Vu
(74) *Attorney, Agent, or Firm*—Young & Thompson

(57) ABSTRACT

A semiconductor memory device includes first and second source/drain regions, and first and second semiconductor regions. The first source/drain region of a first conductive type is formed in a first well region of a second conductive type for a pair of first MIS-type transistors of the first conductive type. The second source/drain region of the second conductive type is formed in a second well region of the first conductive type for a pair of second MIS-type transistors of the second conductive type. The first semiconductor region of the second conductive type is formed in the first source/drain region. The second semiconductor region of the first conductive type is formed in the second source/drain region.

12 Claims, 24 Drawing Sheets

SEMICONDUCTOR MEMORY DEVICE WITH PLURAL SOURCE/DRAIN REGIONS

BACKGROUND OF THE INVENTION

1. Field of the Invention

The present invention relates to a semiconductor memory device and a manufacturing method for the same. More particularly, the present invention relates to a semiconductor memory device of a full CMOS (Complementary Metal Oxide Semiconductor) type SRAM (Static Random Access Memory) and a manufacturing method for the same.

2. Description of the Related Art

Semiconductor memory devices are mainly classified into a volatile memory in which a stored data is erased while power supply is turned off, and a non-volatile memory in which the stored data is not erased even if the power supply is turned off. RAM is well known as the volatile memory, and ROM (Read Only Memory) is well known as the nonvolatile memory. The RAM is classified into SRAM (Static RAM) and DRAM (Dynamic RAM). Most of these semiconductor memory devices are formed from MOS-type transistors which are excellent in the density.

Also, especially, the SRAM as the volatile memory has an advantage that it is superior in the high-speed operation and does not necessitate a complex refreshing operation indispensable in the DRAM to update memory data periodically. From this reason, SRAM is used in wide fields. The above-mentioned SRAM has one memory cell which stores 1-bit data basically by a flip-flop formed by combining two inverters. There are some types in SRAM according to specific configuration method of the flip-flop.

The most general SRAM at present is a full CMOS type SRAM (hereinafter, to be referred to simply as CMOS type SRAM), in which one memory cell is formed by combining six MOS-type transistors. As shown in an equivalent circuit diagram of FIG. 1, one memory cell MC of the SRAM is composed of six transistors, namely, a pair of NMOS transistors as a pair of access transistors (transfer transistors) Q1 and Q2, a pair of NMOS transistors as a pair of driver transistors (drive transistors) Q3 and Q4, and a pair of PMOS transistors as a pair of load transistors Q5 and Q6. A set of the load transistor Q5 as the PMOS transistor and the driver transistor Q3 as the NMOS transistor and a set of the driver transistor Q4 as the NMOS transistor and the load transistor Q6 as the PMOS transistor form a CMOS-type inverters. The input of each inverter and output of the other inverter are connected so as to cross each other to from a flip-flop.

The gates of the access transistors Q1 and Q2 are both connected with a word line WL and the sources of the transistors Q1 and Q2 are connected with a bit line BL and an inversion bit line BL, respectively. Also, the sources of the load transistors Q5 and Q6 are both connected with a power supply voltage VDD whereas the sources of the driver transistors Q3 and Q4 are both connected with a ground voltage VSS (GND). The above-mentioned memory cells MC are arranged in a matrix to form a memory cell array. In this way, the CMOS type SRAM is manufactured. According to the CMOS type SRAM with the memory cell in which the flip-flop is formed by combining two CMOS-type inverters, the SRAM has the advantage of the CMOS-type inverter, and especially can operate at a low consumption power, in addition to the above-mentioned advantage. Thus, the SRAM is used in the wide fields of the memory.

By the way, in the CMOS type SRAM, an NMOS transistor and a PMOS transistor are formed adjacent to each other on a same semiconductor substrate, as well known. In this case, an NPN-type transistor and a PNP-type transistor are produced parasitically on the sides of the NMOS type transistor and the PMOS type transistor, respectively. For this reason, a phenomenon that extraordinary current flows from the power supply voltage VDD to the ground voltage VSS, i.e., so-called latch-up is caused. In accompaniment with the smaller size of the transistor through the increase of the memory capacity of the SRAM, the latch-up endurance is deteriorated.

As one of the prevention methods of such latch-up, a method is adopted in which the voltages of a P-type well region where NMOS transistors are formed and an N-type well region where a PMOS transistor is formed are fixed. Specifically, the N-type well contact region to be connected with the power supply voltage VDD is formed in the N-type well region whereas the P-type well contact region to be connected with the ground voltage VSS is formed in the P-type well region. In this case, the effect of the latch-up prevention can be improved as much as the N- and P-type well contact regions are frequently arranged to the number of the memory cells. Thus, the latch-up endurance can be improved.

For example, a semiconductor memory device is disclosed in Japanese Laid Open Patent Application (JP-P2001-358232A), in which each of well contact regions is formed to prevent the latch-up. In a memory cell array MCA of the semiconductor memory device, as shown in FIG. 2, a plurality of memory cells MC are arranged in a matrix in a direction of x and a direction of y. An $n^+$-well contact region (high concentration n well contact region) 15a is provided for every 32 memory cells MC arranged in the x direction and an $p^+$-well contact region (high concentration p well contact region) 17a is provided for every 2 memory cells MC arranged in the y direction. In this conventional example, the frequency of the arrangement of the high concentration n-well contact regions 15a in the x direction in this example is one to 32 memory cells MC. On the other hand, the frequency of the arrangement of the high concentration p-well contact region 17a in the y direction is one to the two memory cells MC. It should be noted that a plurality of word lines 23 are arranged in the x direction and inter-word-line regions 91 and 93 are alternately arranged between the word lines 23. A symbol A shows the region of one memory cell MC.

As shown in FIGS. 10 to 13 of Japanese Laid Open Patent Application (JP-P2001-358232A), the high concentration n well contact region 15a is connected with branch sections 33a and 33b as a second layer through plug 61. Also, the high concentration n well contact region 15a is connected with the power supply voltage contact pad layer 49 as a third layer through a plug 75. Also, the high concentration n well contact region 15a is connected with the power supply voltage interconnection 57 as a fourth layer through a plug 81. On the other hand, the high concentration p well contact region 17a is connected with the ground voltage local interconnection 37 as a second layer through a plug 61. Also, the high concentration p well contact region 17a is connected with the ground voltage contact pad layer 47 as a third layer through a plug 75. Moreover, the high concentration p well contact region 17a is connected with the ground voltage interconnection 55 as a fourth layer through a plug 81. By adopting such a structure, the high concentration n well contact region 15a is fixed to the power supply voltage potential whereas the high concentration p well contact region is fixed to the ground voltage. Therefore, the latch up can be prevented.

By the way, in the above conventional semiconductor memory device, it is necessary to add each well contact region for the latch up prevention to the regions for an original memory cell in the memory cell array chip. Therefore, the region of the memory cell array chip increases for the well contact regions, resulting in cost up.

That is, the high concentration n well contact region 15a and the high concentration p well contact region 17a for the latch up prevention which are described in the above conventional example do not have relation to the original operation of the memory cell. Thus, by providing the well contact regions 15a and 17a, the chip area is occupied. As a result, the chip area for the array of the memory cells increases.

For example, as shown in the FIG. 11 of the above conventional example, the high concentration p well contact regions 17a are arranged in the x direction between high concentration n-type source/drain regions 11a2 and 11a3. In order to fix the contact region 17a to the ground voltage, the contact region 17a must be connected with the ground voltage local interconnection 37 as the second layer through the plug 61 as mentioned above. Also, the contact region 17a must be connected with the ground voltage contact pad layer 47 as the third layer through the plug 75 and moreover with the ground voltage interconnection 55 as the fourth layer through a plug 81. In this way, in order to fix the contact regions 17a on the ground voltage, a lot of plugs and interconnection become necessary. However, these plugs and the interconnections are unnecessary components in the original memory cell. They become the cause to increase the chip area of the memory cell array, as mentioned above. That is, if the frequency of the arrangement of the well contact regions 17a and 15a is increased for improving the latch-up endurance, the chip area of the memory cell array increases.

In conjunction with the above description, a semiconductor device is disclosed in Japanese Laid Open Patent Application (JP-P 2002-343890A). In this conventional example, the semiconductor device has a memory cell which contains a first load transistor, a second load transistor, a first drive transistor, a second drive transistor, a first transfer transistor and a second transfer transistor. The semiconductor device in this conventional example is composed of a first conductive type well region extending in a first direction, a word line extending in the first direction above the first conductive type well region, and a first device forming region provided in the first conductive type well region. The first device forming region contains first to fifth active regions. The third to fifth active regions are provided between the first active region and the second active region. The first active region and the second active region are provided continuously from the third to fifth active regions.

Also, a semiconductor memory device is disclosed in Japanese Laid Open Patent Application (JP-P 2003-60088A). In this conventional example, the semiconductor memory device has a first diffusion region of a P-type formed above a stripe-like N well. A second diffusion region of an N-type is formed above a stripe-like P well which is provided adjacent to the N well. An N well contact region is formed above the N well and the P well as a unit with the second well region. A P well contact region is formed above the N well and the P well as a unit with the first well region.

SUMMARY OF THE INVENTION

Therefore, an object of the present invention is to provide a semiconductor memory device and a manufacturing method for the same, in which latch-up endurance can be improved without increasing a chip region for a memory cell array.

In an aspect of the present invention, a semiconductor memory device includes first and second source/drain regions, and first and second semiconductor regions. The first source/drain region of a first conductive type is formed in a first well region of a second conductive type for a pair of first MIS-type transistors of the first conductive type. The second source/drain region of the second conductive type is formed in a second well region of the first conductive type for a pair of second MIS-type transistors of the second conductive type. The first semiconductor region of the second conductive type is formed in the first source/drain region. The second semiconductor region of the first conductive type is formed in the second source/drain region.

Here, the first semiconductor region is formed to pass through the first source/drain region to the first well region, and the second semiconductor region is formed to pass through the second source/drain region to the second well region.

Also, the first well region may be connected with a power supply potential, and the second well region may be connected with a ground potential.

Also, the first conductive type may be an N conductive type and the second conductive type may be a P conductive type.

Also, the semiconductor memory device may further include a first salicide layer formed in common to a surface of the first source/drain region and a surface of the first semiconductor region; and a second salicide layer formed in common to a surface of the second source/drain region and a surface of the second semiconductor region.

In this case, each of the first and second salicide layers may be one of Co salicide layer and a Ti salicide layer. Also, the first salicide layer may be connected with a power supply potential and the second salicide layer may be connected with a ground potential.

Also, one of the pair of first MIS-type transistors and one of the pair of second MIS-type transistors are connected to constitute a first inverter, and the other of the pair of first MIS-type transistors and the other of the pair of second MIS-type transistors are connected to constitute a second inverter. An input of one of the first and second inverters is connected with an output of the other.

In this case, the semiconductor memory device may further include a pair of third MIS-type transistors of the first conductive type formed in the first well region. One of the pair of third MIS-type transistors has a gate connected a word line, a source connected with one of a pair of bit lines, and a drain connected with the input of one of the first and second inverters and the output of the other, and the other of the pair of third MIS-type transistors has a gate connected the word line, a source connected with the other of a pair of bit lines, and a drain connected with the output of the one of the first and second inverters and the input of the other.

In this case, the semiconductor memory device may further include first and second contacts connected with the first and second semiconductor regions, respectively. It is desirable that the first contact is formed between the first MIS-type transistors and between the pair of first MIS-type transistors and the word line, and the second contact is formed between the second MIS-type transistors and on a side opposite to the pair of first MIS-type transistors.

BRIEF DESCRIPTION OF THE DRAWINGS

FIGS. 6A to 14B are diagrams showing a manufacturing method of the semiconductor memory device in the first embodiment, wherein FIGS. 6A to 14A are plan views showing the semiconductor memory device in the first embodiment in the manufacturing method, and FIGS. 6B to 14B are cross sectional views showing the semiconductor memory device in the first embodiment in the manufacturing method along the A-A lines of FIGS. 6A to 14A;

DESCRIPTION OF THE PREFERRED EMBODIMENTS

Hereinafter, a semiconductor memory device of the present invention will be described in detail with reference to the attached drawings.

Figure 4:
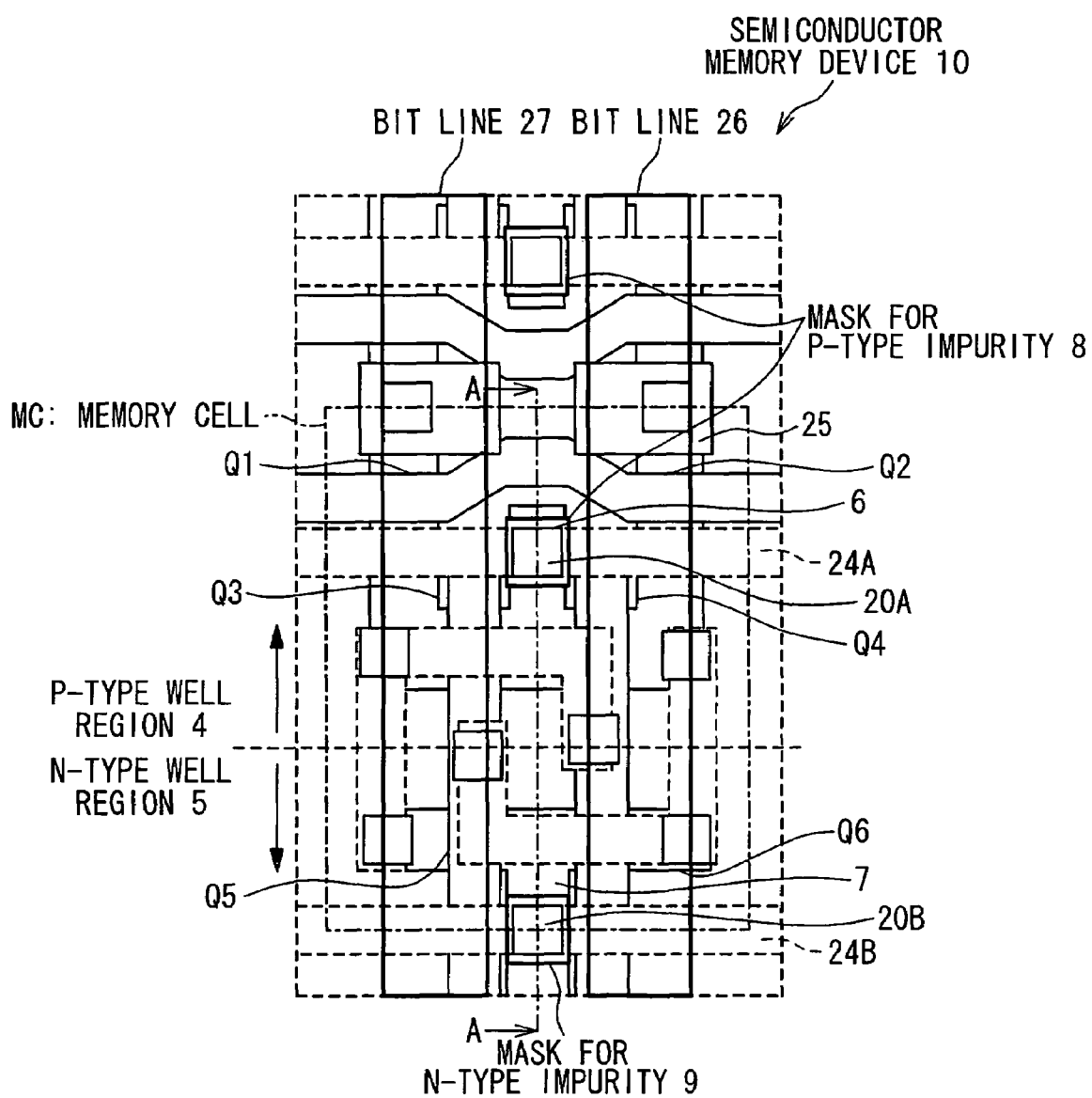
FIG. 4 is a plan view showing the pattern structure of a CMOS type SRAM as a semiconductor memory device according to a first embodiment of the present invention.
Figure 5:
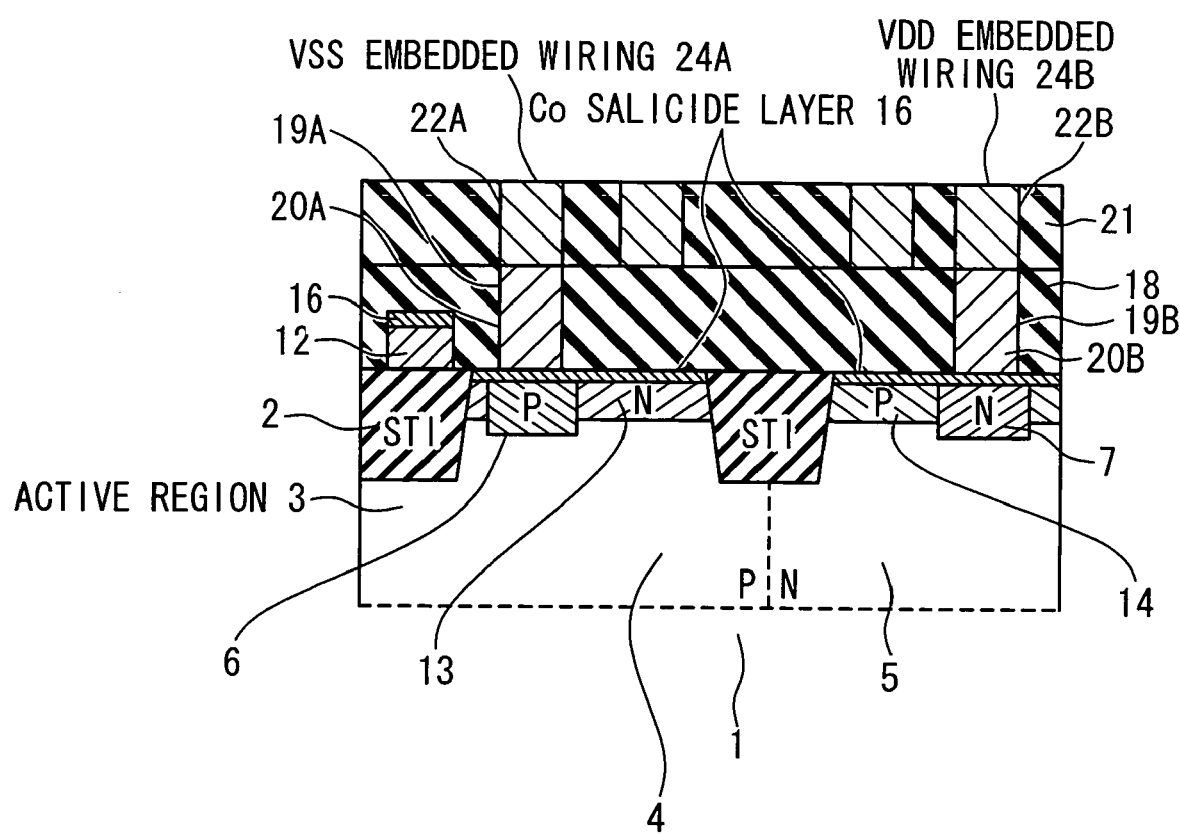
FIG. 5 is a cross sectional view of the semiconductor memory device in the first embodiment along the line A-A of FIG. 4.
Figure 14A:
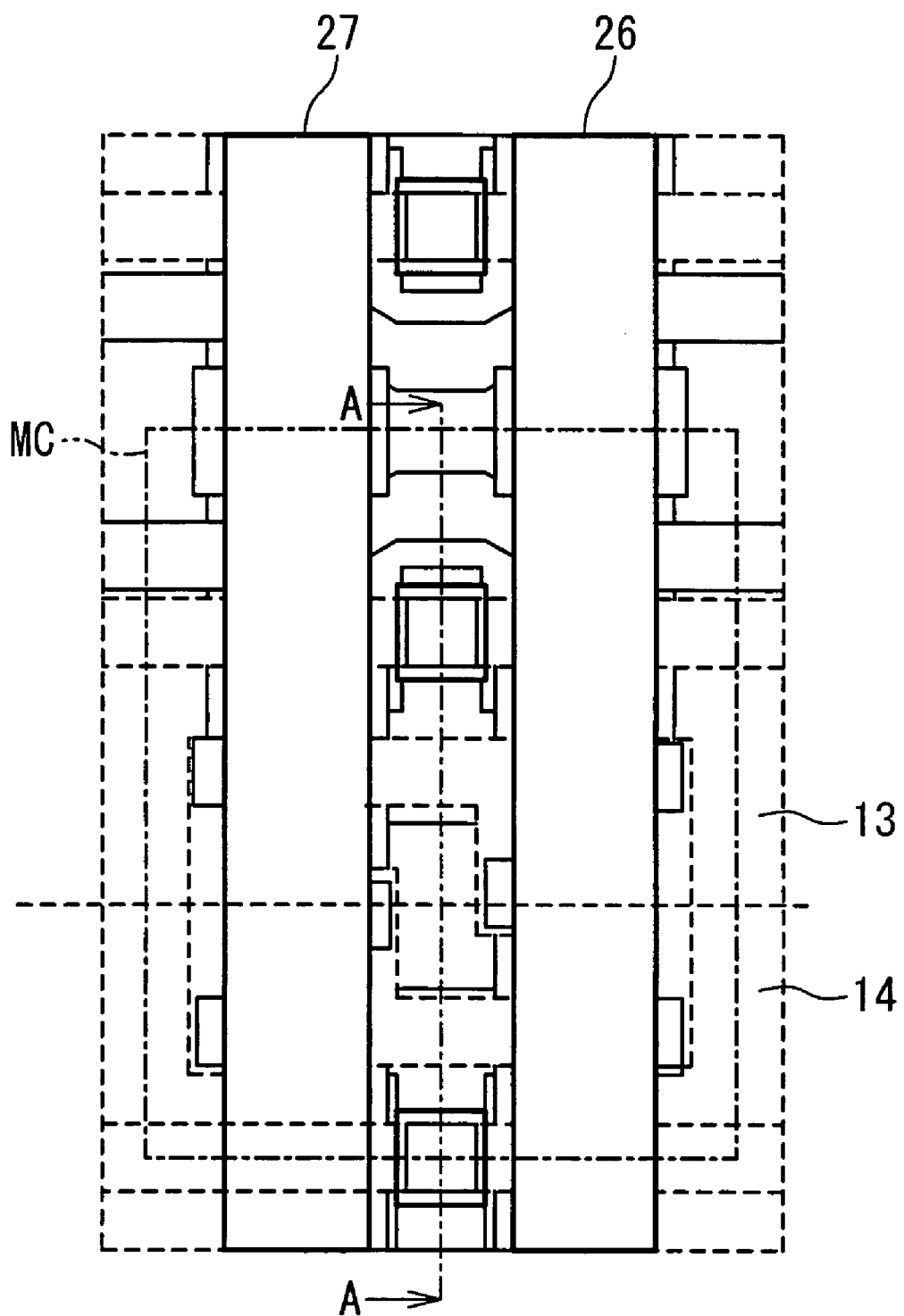
Figure 14B:
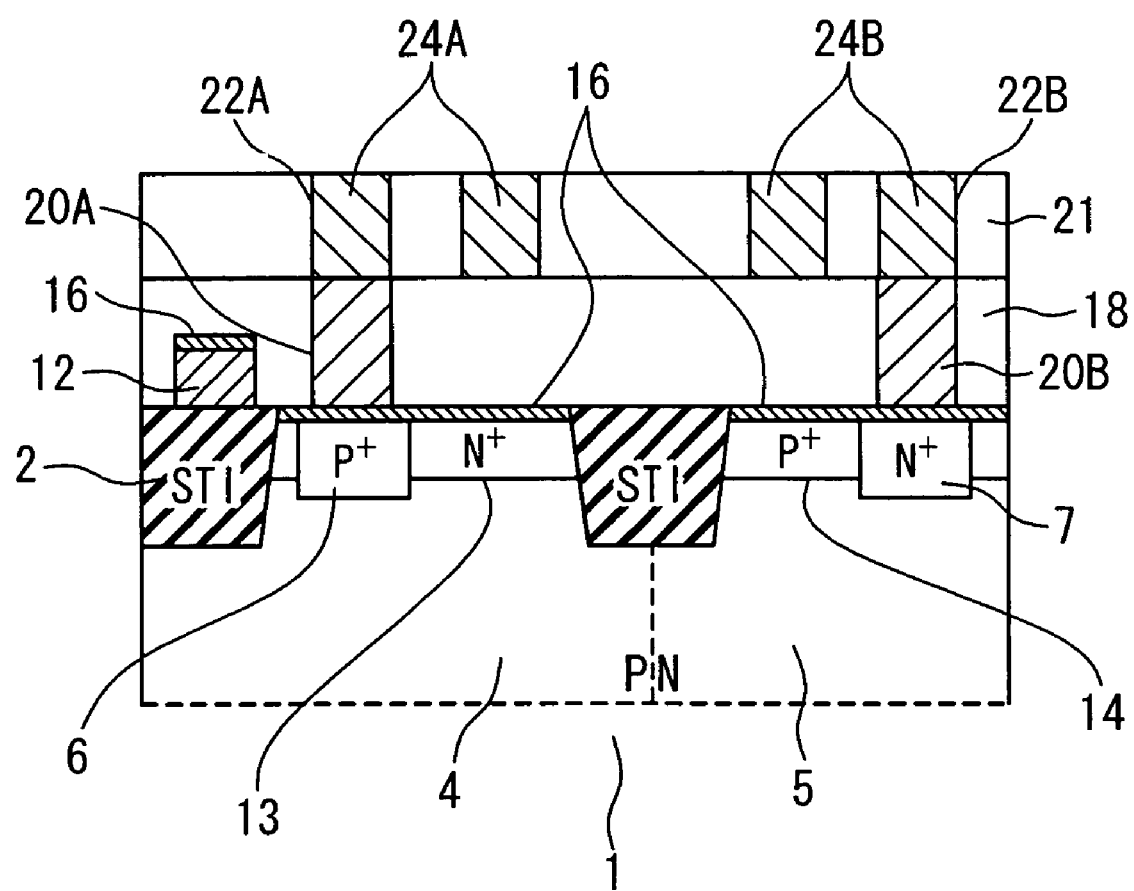
Figure 15:
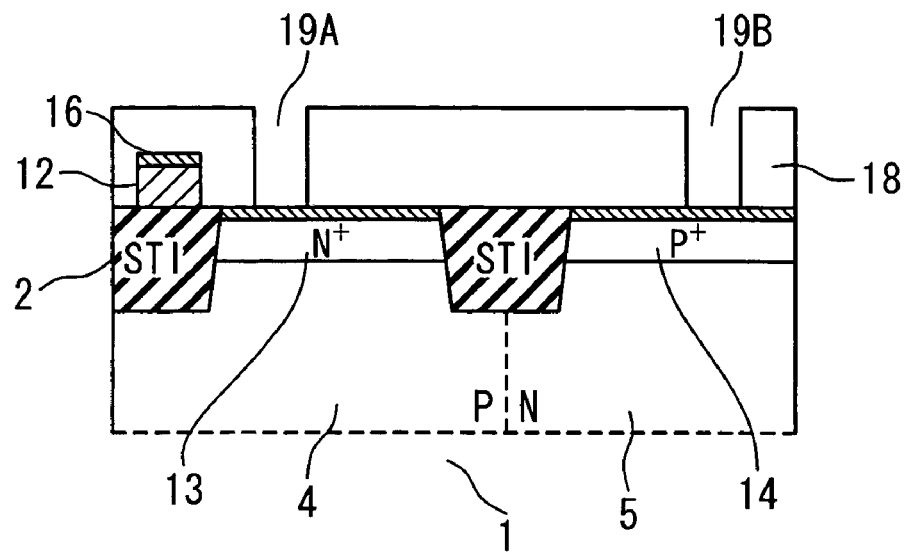
FIGS. 15 and 16 are cross sectional views showing a portion of the manufacturing method of the semiconductor memory device in the second embodiment of the present invention.
Figure 16:
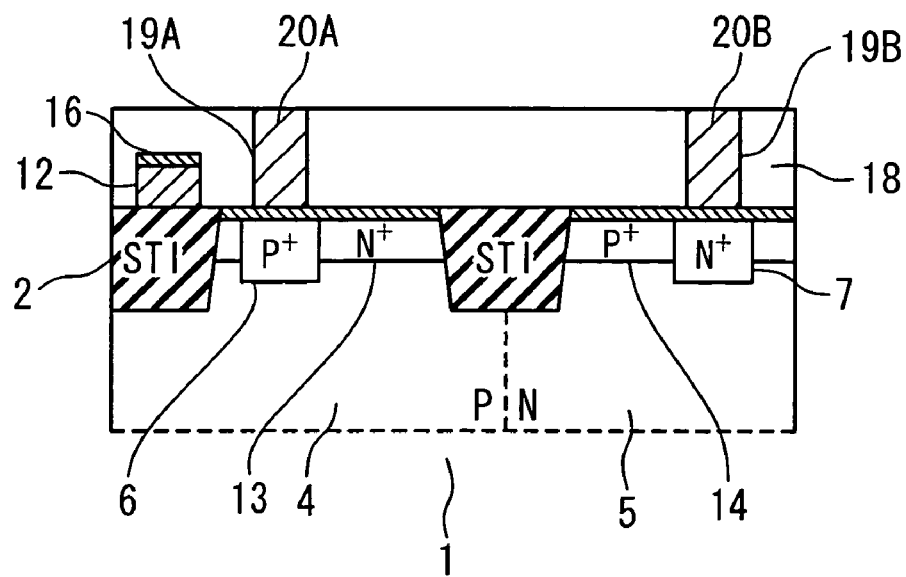

FIG. 4 shows the structure of a CMOS type SRAM as the semiconductor memory device according to the first embodiment of this invention. FIG. 5 is a cross sectional view along the A-A line in FIG. 4. FIGS. 6A to 14B show a first manufacturing method of the semiconductor memory device of the present invention. FIGS. 6A to 14A are plan views and FIGS. 6B to 14B are cross sectional views along the A-A line. Also, FIGS. 15 and 16 are cross sectional views showing main processes of a second manufacturing method of the semiconductor memory device.

As shown in FIGS. 4 and 5, in the semiconductor memory device 10 in this embodiment, one memory cell (MC) is composed of a pair of PMOS (P-channel MOS) transistors as a pair of load transistors Q5 and Q6 formed in an N-type well region 5, a pair of NMOS (N-channel MOS) transistors as a pair of access transistors Q1 and Q2 formed in a P-type well region 4, and a pair of NMOS transistors as a pair of driver transistors Q3 and Q4 in the P-type well region 4.

In a semiconductor substrate 1 of an N-type or P-type silicon, an active region 3 is formed to be surrounded by device separation regions 2 formed by the well-known STI (Shallow Trench Isolation) method. In this active region 3, the P-type well region 4 and the N-type well region 5 are formed adjacently to each other. N$^+$-type (hereinafter, to be referred to as a high concentration N-type) source/drain regions 13 are formed in the P-type well region 4 for the NMOS transistors of the pair of access transistors Q1 and Q2 and the pair of driver transistors Q3 and Q4. P$^+$-type (hereinafter, to be referred to as a high concentration P-type) source/drain regions 14 are formed in the N-type well region 5 for the pair of PMOS transistors of the pair of load transistors Q5 and Q6.

Also, a high concentration P-type ground potential region 6 is formed in the high concentration N-type source/drain region 13 to pass through this source/drain region 13 and to contact a P-type well region 4. A high concentration N-type power supply potential region 7 is formed in the high concentration P-type source/drain region 14 to pass through this source/drain region 14 and to contact the N-type well region 5. That is, the high concentration N-type source/drain region 13, and the high concentration P-type source/drain region 14 are formed to be shallower than the high concentration P-type ground potential region 6 and the high concentration N-type power supply potential region 7. The high concentration P-type ground potential region 6 functions as a part of a path for connecting the ground potential (VSS) with the P-type well region 4. In the same way, the high concentration N-type power supply potential region 7 functions as a part of a path for connecting the power supply potential (VDD) with the N-type well region 5.

A gate interconnection 12 of polysilicon is formed on a desired region which contains the device separation region 2. Co (cobalt) salicide layers 16 are formed in common on the surfaces of the gate interconnections 12, high concentration N-type source/drain region 13, high concentration P-type ground potential region 6, high concentration P-type source/drain region 14 and high concentration N-type power supply potential region 7. By forming the Co salicide layers 16 on the desired region in this way, it is possible to reduce the resistance of the gate interconnection 12. Also, when an electrode is formed on each of the high concentration P-type ground potential region 6, the high concentration N-type power supply potential region 7, the high concentration N-type source/drain region 13, and the high concentration P-type source/drain region 14, it is possible to reduce the resistance of the electrode.

An interlayer insulating film 18 of silicon oxide (SiO$_2$) is formed to cover the whole surface, containing the surfaces of the Co salicide layers 16. Contact holes 19A and 19B are formed in the interlayer insulating film 18 to expose a part of each of the Co salicide layers 16 on the P-type well region 4 and the N-type well region 5. Contacts 20A and 20B are formed by filling these contact holes 19A and 19B with W (tungsten). Moreover, another interlayer insulating film 21 is formed on the interlayer insulating film 18. Contact holes 22A and 22B are formed in the interlayer insulating film 21 to expose the contact 20A and 20B on the P-type well region 4 and the N-type well region 5. An embedded interconnection 24A for the ground potential VSS and an embedded interconnection 24B for the power supply potential VDD are formed by embedding W in these contact holes 22A and 22B. Via-interconnections 25 are formed on these embedded interconnections 24A and 24B, and bit lines 26 and 27 are formed on the via-interconnection 25. Thus, a CMOS type SRAM is formed.

According to the semiconductor memory device 10 with such a structure, it is possible to form the N-type well contact region, i.e., the high concentration N-type power supply potential region 7 which is connected with the power supply potential VDD and the P-type well contact region, i.e., the high concentration P-type ground potential region 6 which is connected with the ground potential VSS for every memory cell MC. Also, it is not necessary to form many plugs and components such as the interconnections, unlike the conventional examples.

Figure 1:
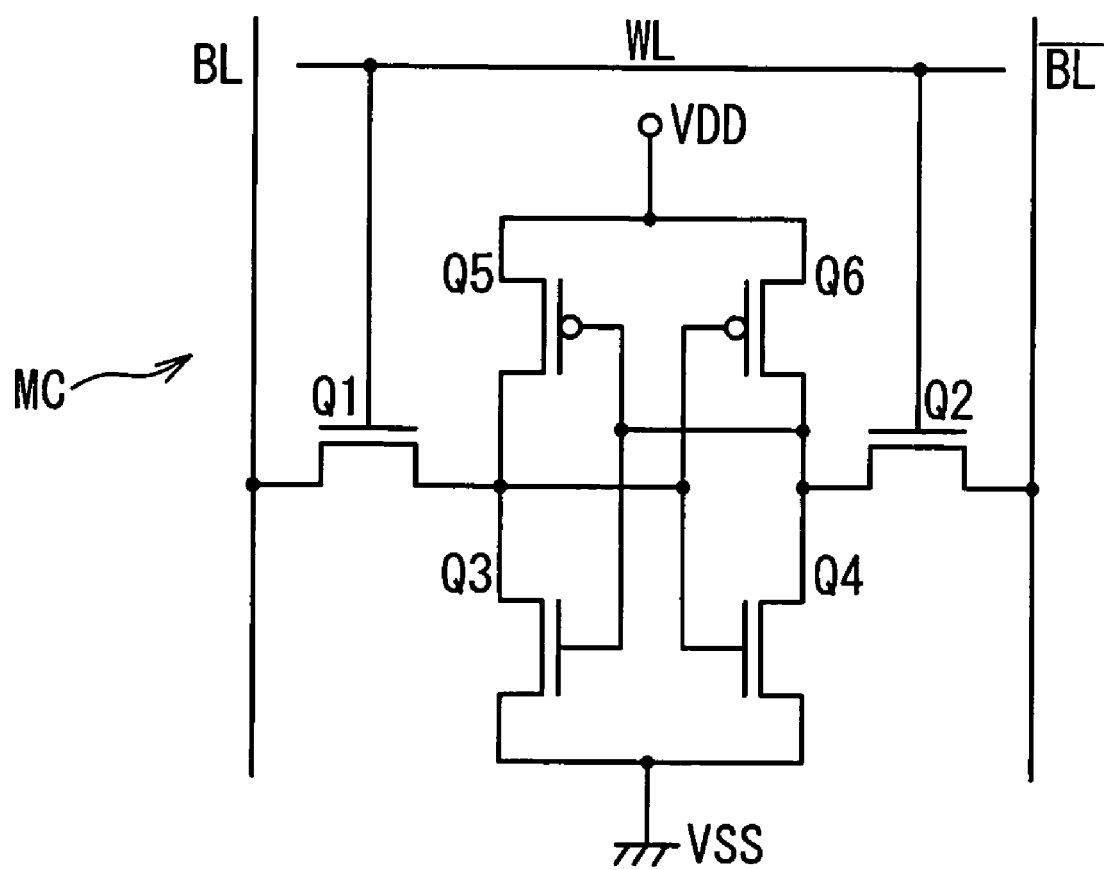
FIG. 1 is an equivalent circuit diagram showing a full CMOS type SRAM of a conventional semiconductor memory device.
Figure 2:
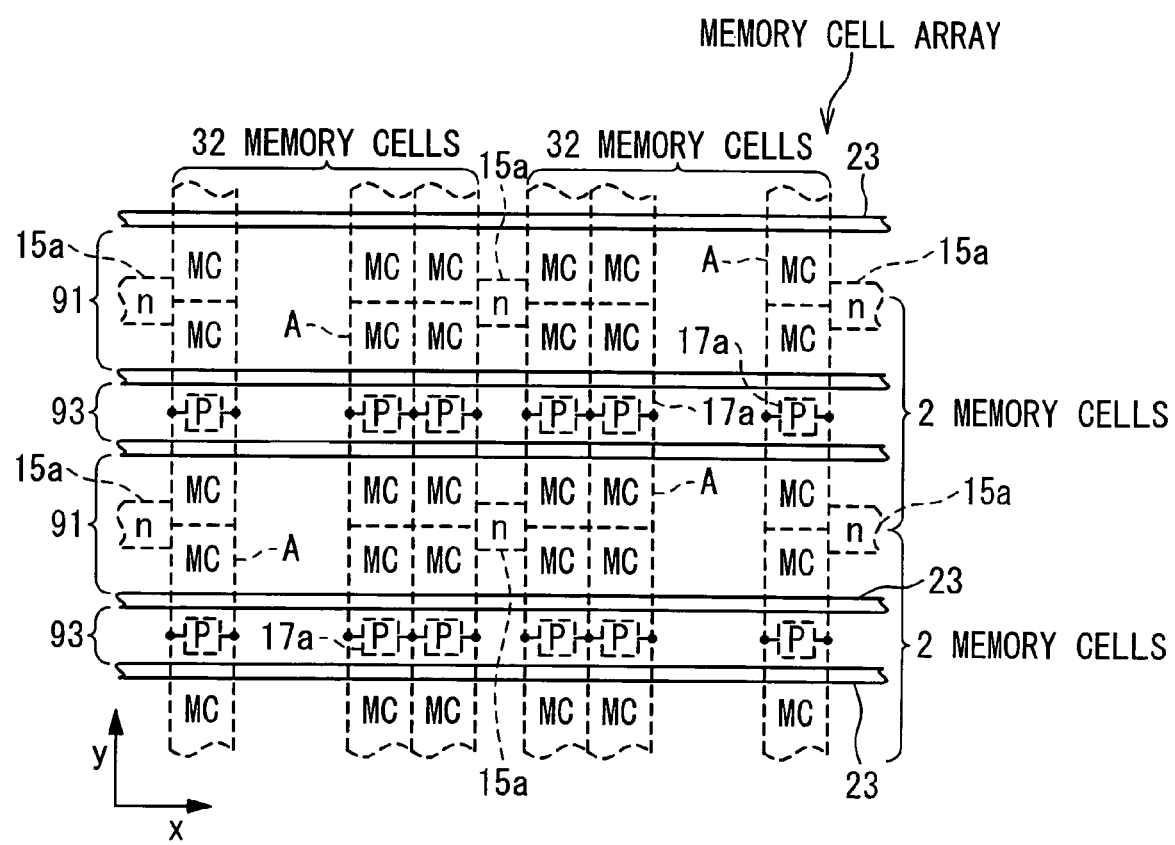
FIG. 2 is a plan view showing the circuit structure of a memory cell array of the conventional semiconductor memory device.
Figure 3:
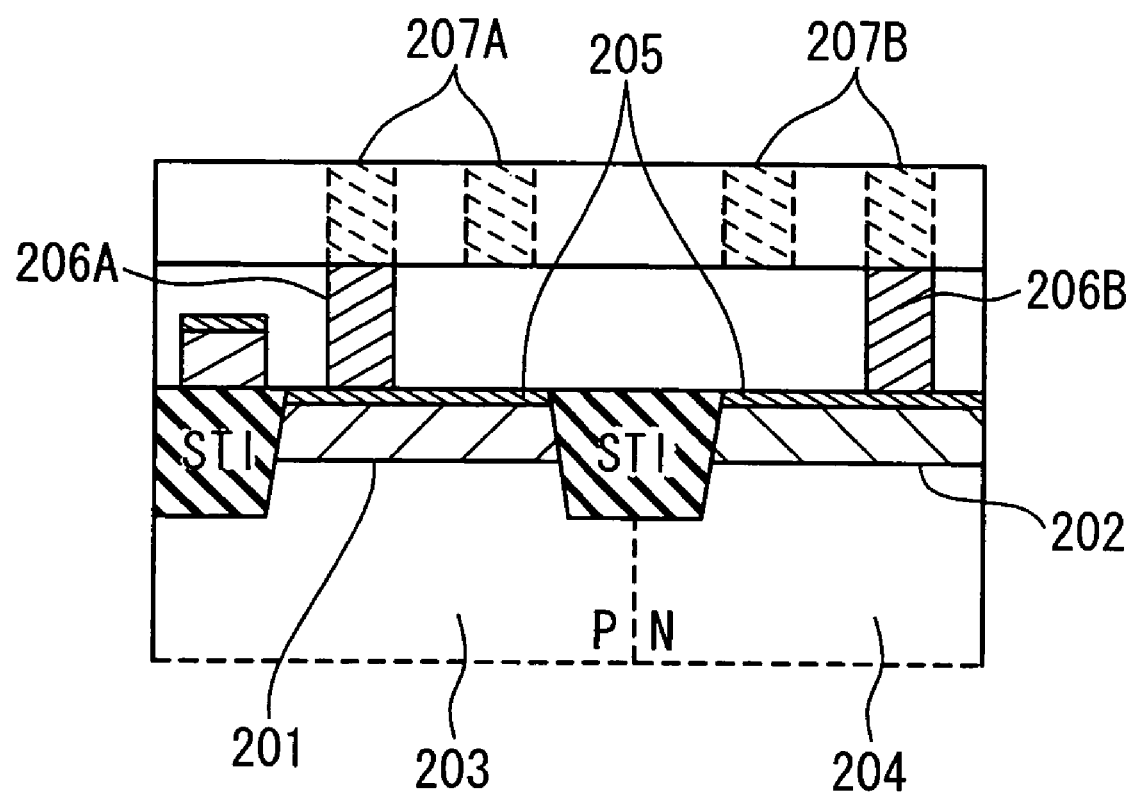
FIG. 3 is a cross sectional view of the conventional semiconductor memory device.

That is, in the conventional example described in Japanese Laid Open Patent Application (JP-P2001-358232A), as shown in FIG. 3, the high concentration P-type ground potential region 6 and the high concentration N-type power supply potential region 7 are not formed in the P-type well region 203 and the high concentration N-type source/drain region 201, which are respectively formed in the N-type well region 204 and the high concentration P-type source/drain region 202, unlike the present invention. Therefore, the PN junctions exist between the P-type well region 203 and the high concentration N-type source/drain region 201 and between the N-type well region 204 and the high concentration P-type source/drain region 202. Thus, the power supply potential VDD is never applied to the N-type well region 204 and the ground potential VSS is never applied to the P-type well region 203. Also, in this embodiment, upper interconnections are only the bit lines 26 and 27, and the ground potential VSS interconnection does not exist. It should be noted that the reference numeral 205 denotes a salicide layer, the reference numerals 206A and 206B, and 207A and 207B respectively denote components corresponding to the Co salicide layer 16, the contact 20A, the contact 20B, a ground potential VSS pad interconnection 24A, and a power supply potential VDD pad interconnection 24B in this embodiment.

Figure 6A:
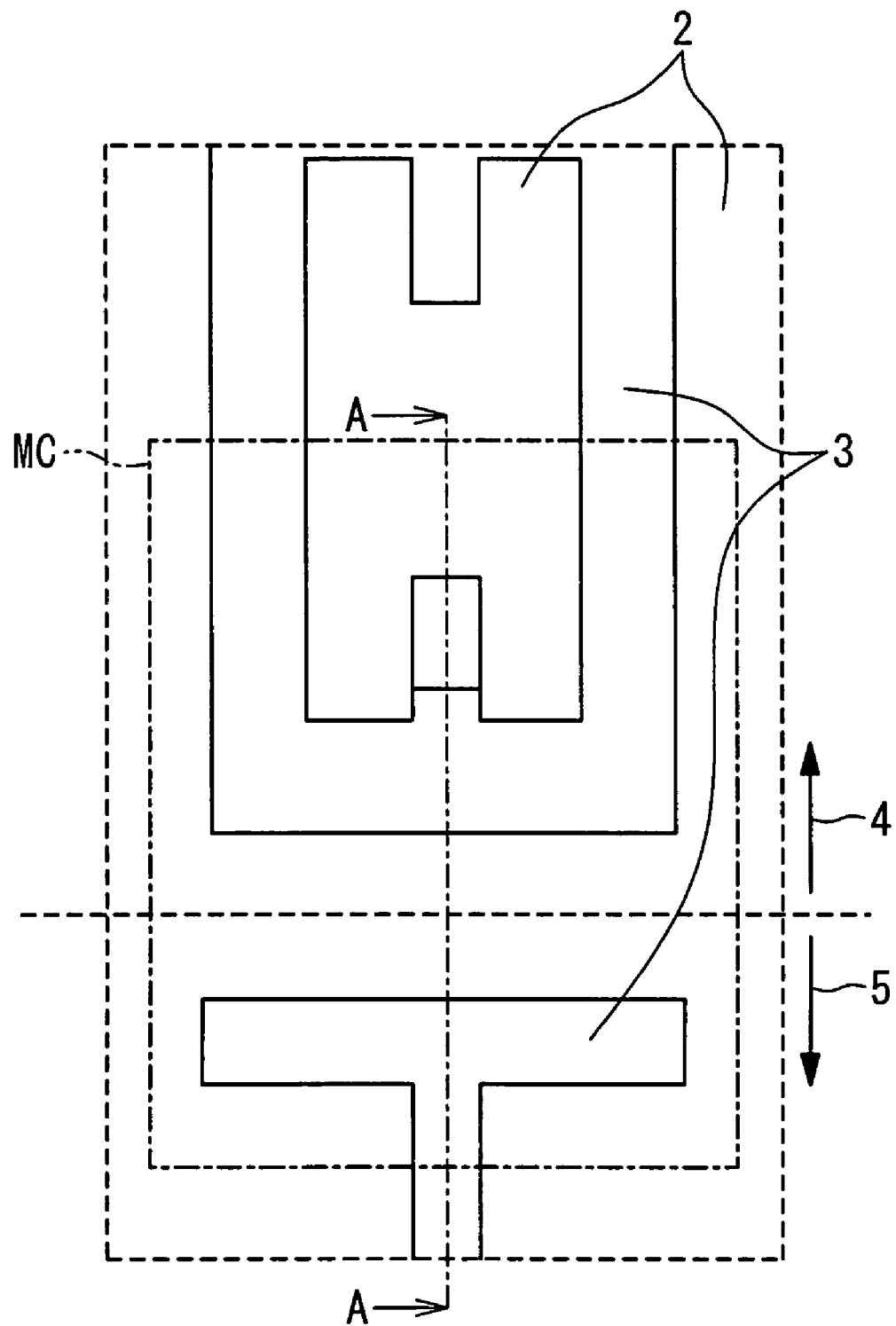
Figure 6B:
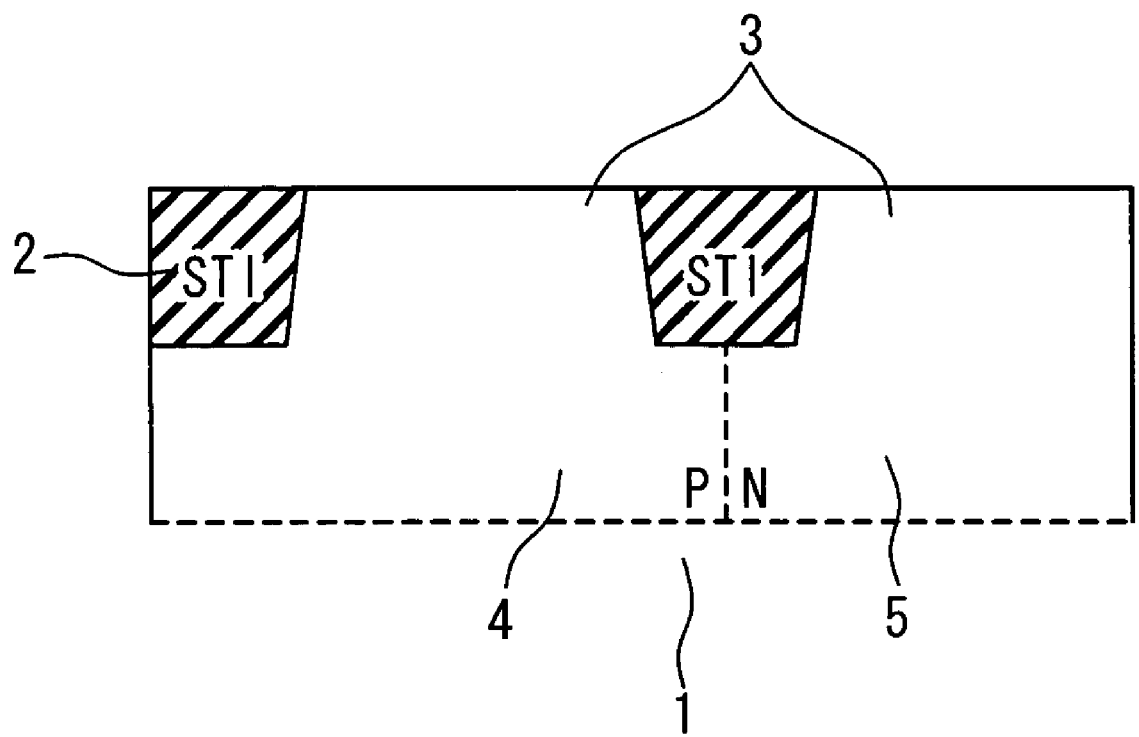

Next, the first manufacturing method of the semiconductor memory device of this example will be described in order of the processes with reference to FIGS. 6A to 14A and FIGS. 6B to 14B. First, the device separation regions 2 are formed in the semiconductor substrate 1 of the N-type or the P-type by the well-known STI method, as shown in FIGS. 6A and 6B. The regions surrounded by the device separation regions 2 are the active region 3 where an MOS-type transistor is formed. Subsequently, the P-type impurity such as B (boron) and the N-type impurity such as P (phosphor) or As (arsenic) are selectively and alternately introduced into the active region 3 by an ion implantation method to form the P-type well region 4 and the N-type well region 5 respectively.

Figure 7A:
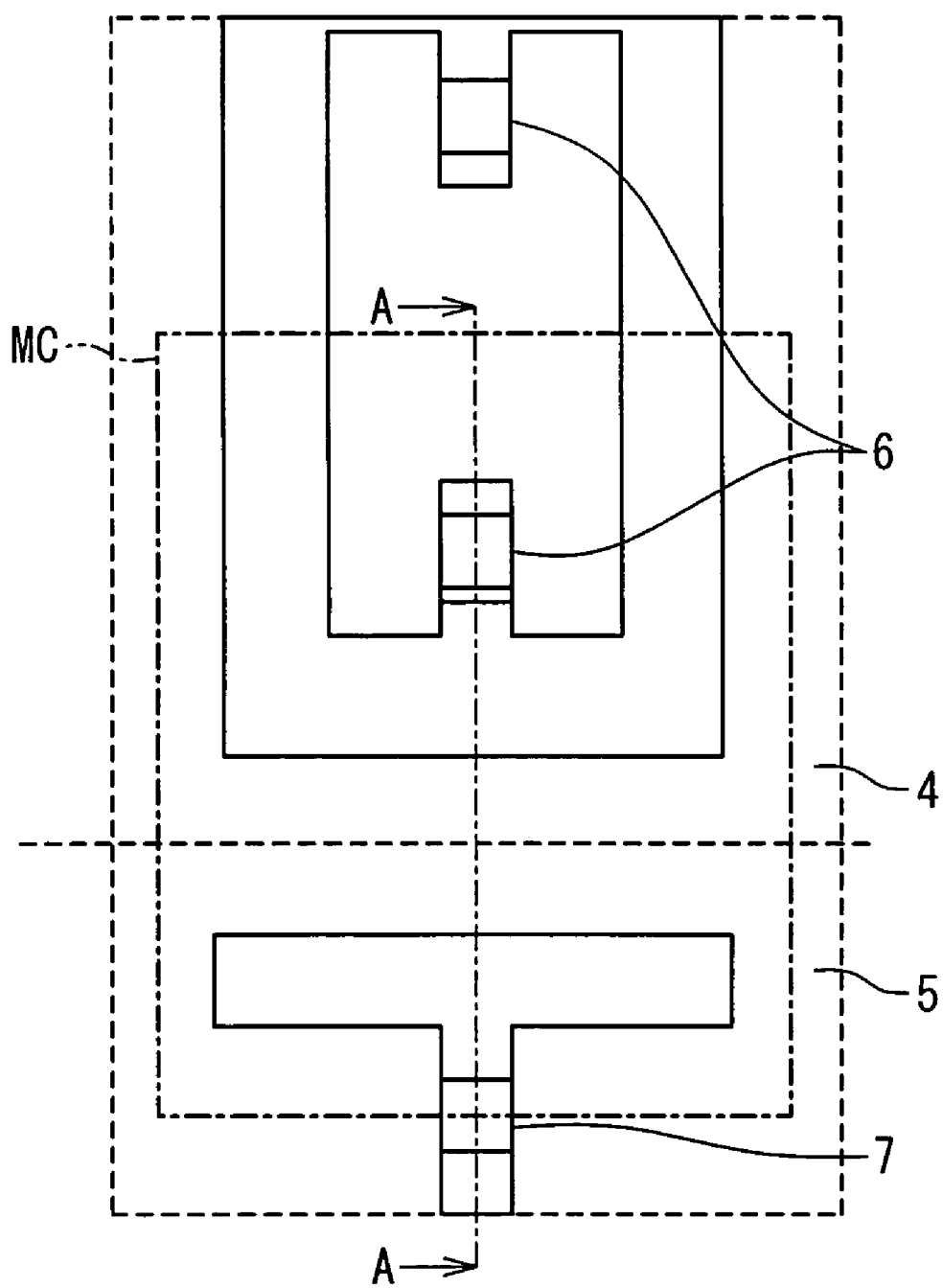
Figure 7B:
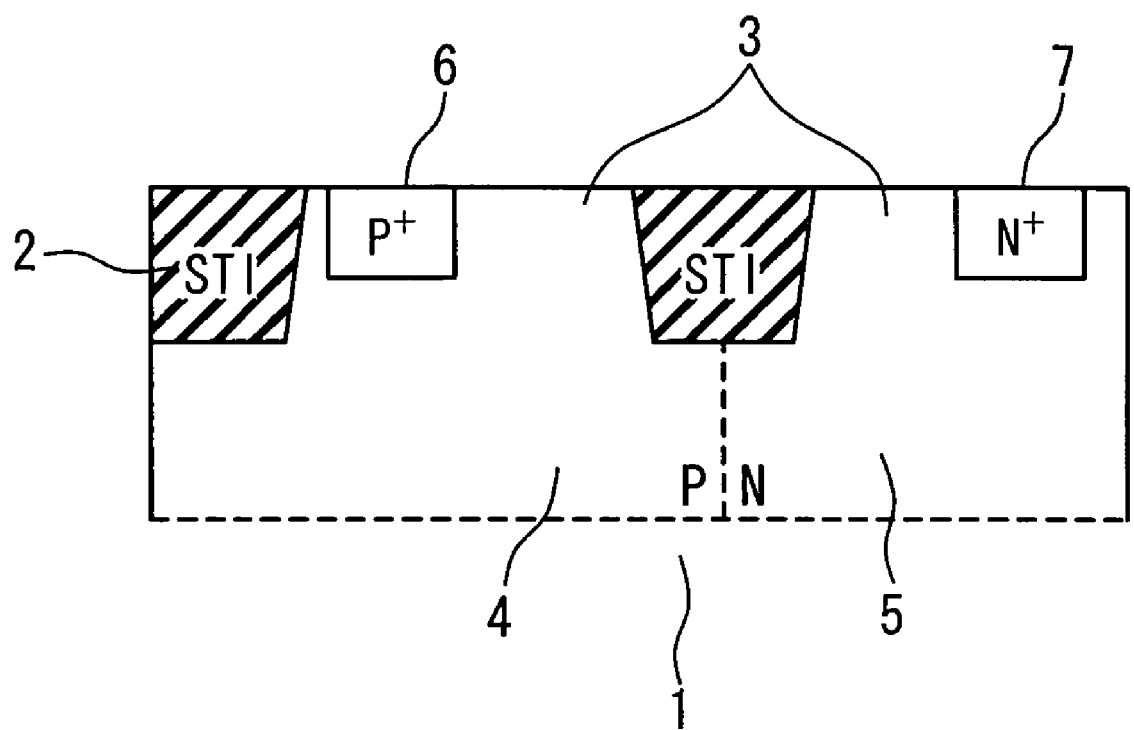

Next, as shown in FIGS. 7A and 7B, the P-type impurity such as B and the N-type impurity such as P or As are selectively injected in the P-type well region 4 and the N-type well region 5 by the ion implantation method to form the high concentration P-type ground potential region 6 and the high concentration N-type power supply potential region 7. When these P-type impurity and N-type impurity are selectively implanted, a selection mask 8 for the P-type impurity introduction and a selection mask 9 for the N-type impurity introduction, which are formed of photo-resist are used, as shown in FIG. 4. These selection masks 8 and 9 are removed after forming of the regions 6 and 7. As described above, the high concentration P-type ground potential region 6 functions as a part of a path to connects the ground potential VSS with the P-type well region 4. In the same way, the high concentration N-type power supply potential region 7 functions as a part of a path to connect the power supply potential VDD with the N-type well region 5.

Figure 8A:
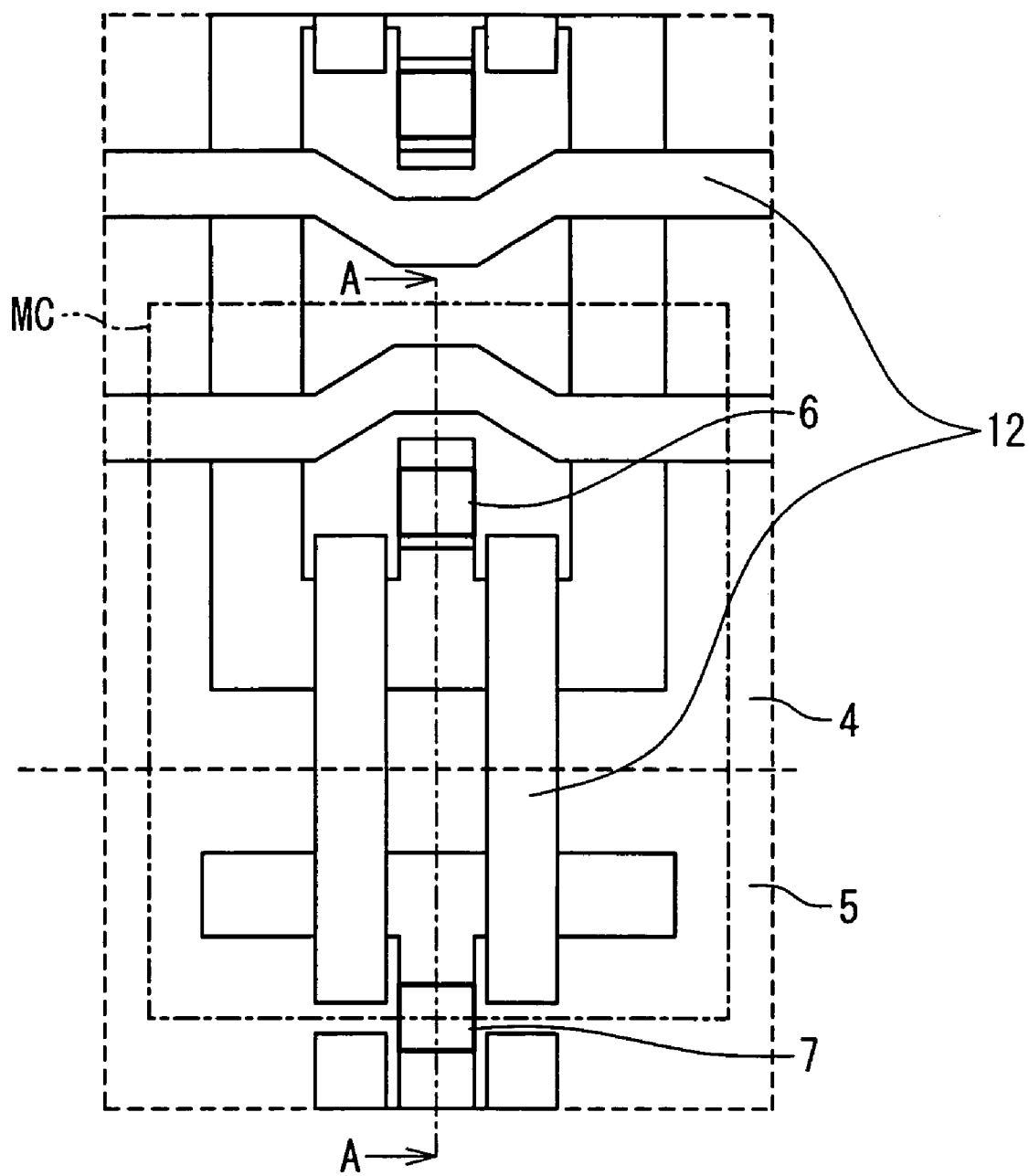
Figure 8B:
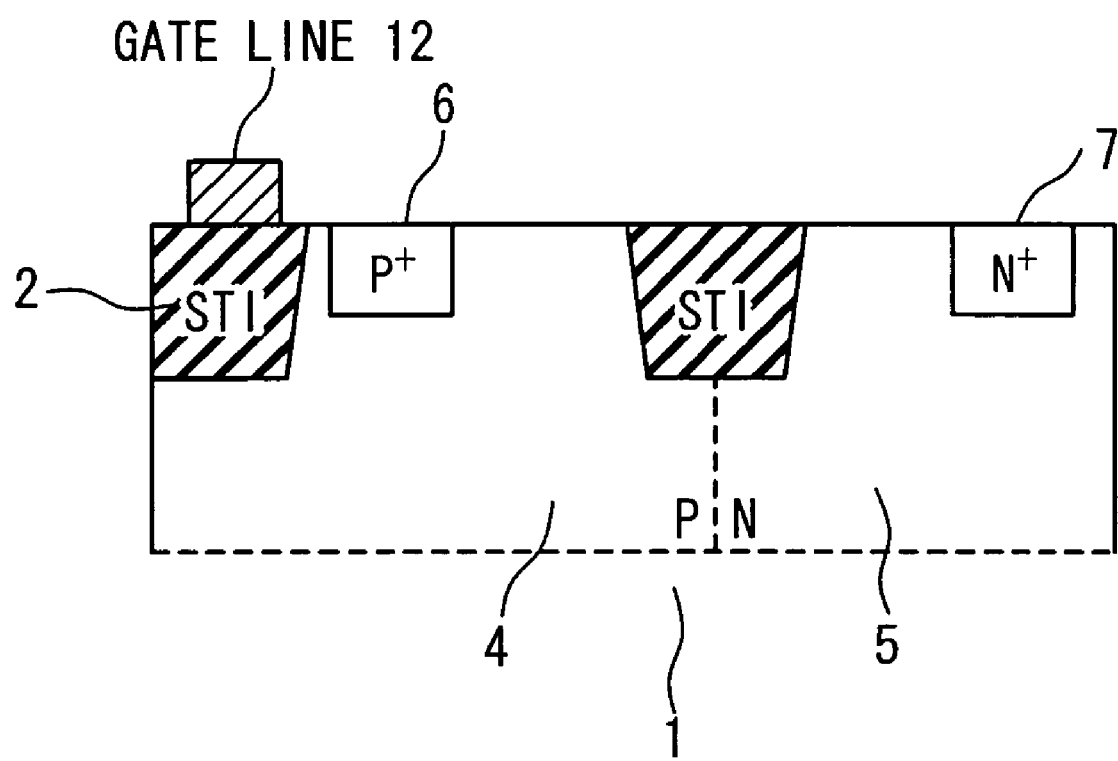

Next, as shown in FIGS. 8A and 8B, a gate interconnection 12 of polysilicon is formed on a desired region, containing the device separation region 2. The gate interconnection 12 is formed by depositing a polysilicon film on the whole surface of substrate 1 by a CVD (Chemical Vapor Deposition) method and then by patterning the polysilicon film to a desired shape by a well-known photolithography method.

Figure 9A:
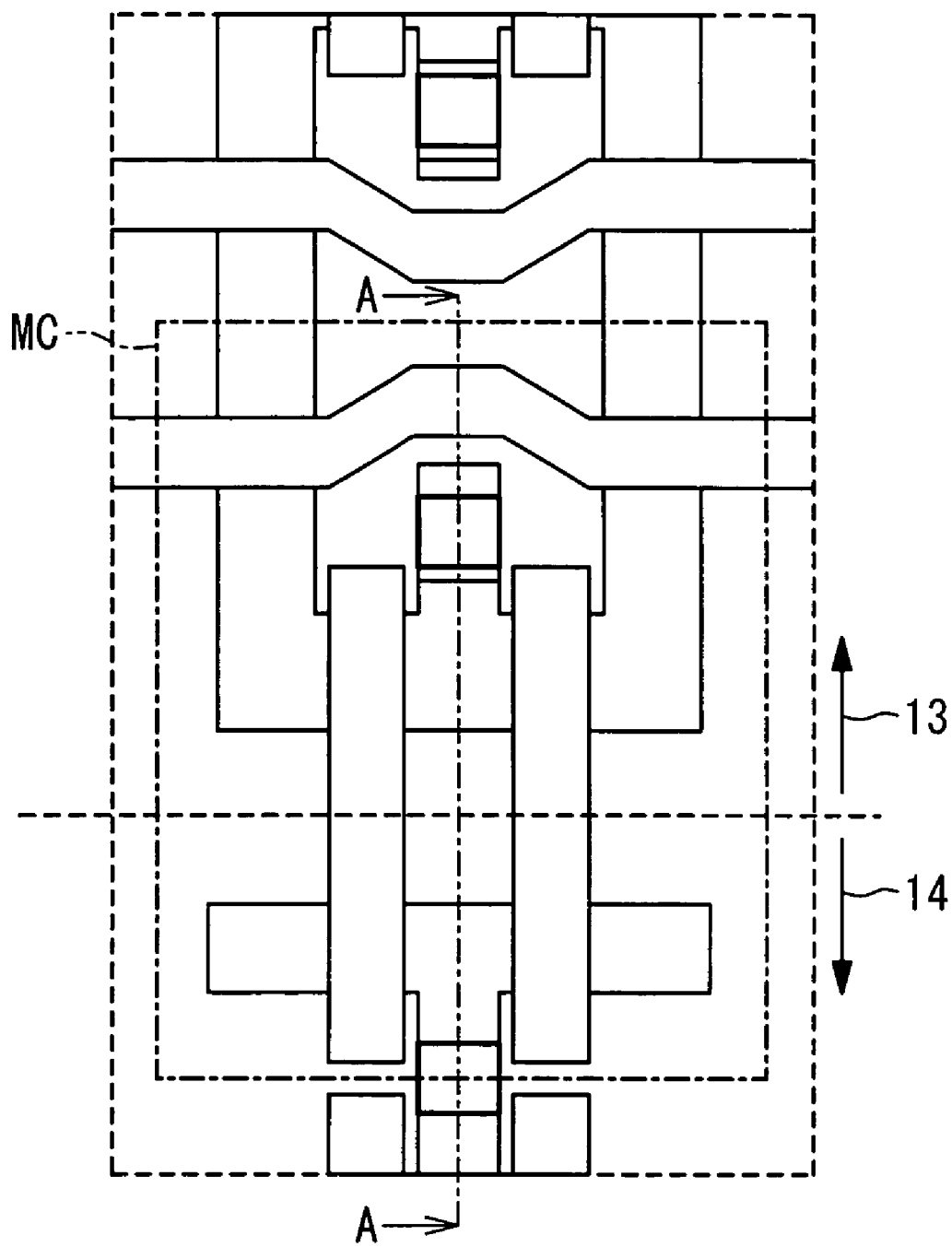
Figure 9B:
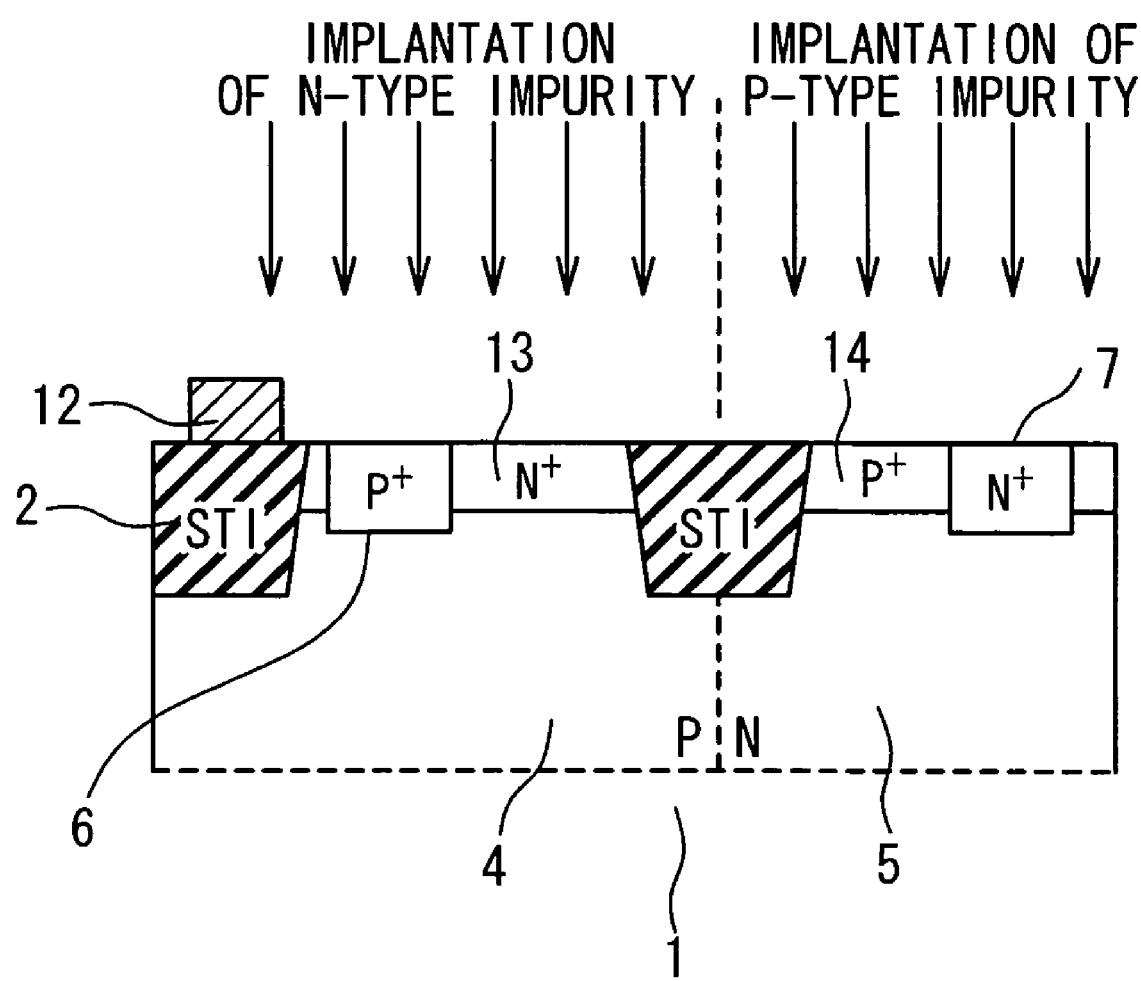

Next, as shown in FIGS. 9A and 9B, the P-type impurity such as B and the N-type impurity such as P or As are selectively and respectively introduced in the N-type well region 5 and the P-type well region 4 by the ion implantation method, to form the high concentration N-type source/drain region 13, and the high concentration P-type source/drain region 14 which are shallower than the high concentration P-type ground potential region 6 and the high concentration N-type power supply potential region 7. At this time, an ion implantation quantity is controlled in such a way that the high concentration P-type ground potential region 6 and the high concentration N-type power supply potential region 7 are extinguished by the high concentration N-type sources/drain region 13 and the high concentration P-type source/drain region 14.

Figure 10A:
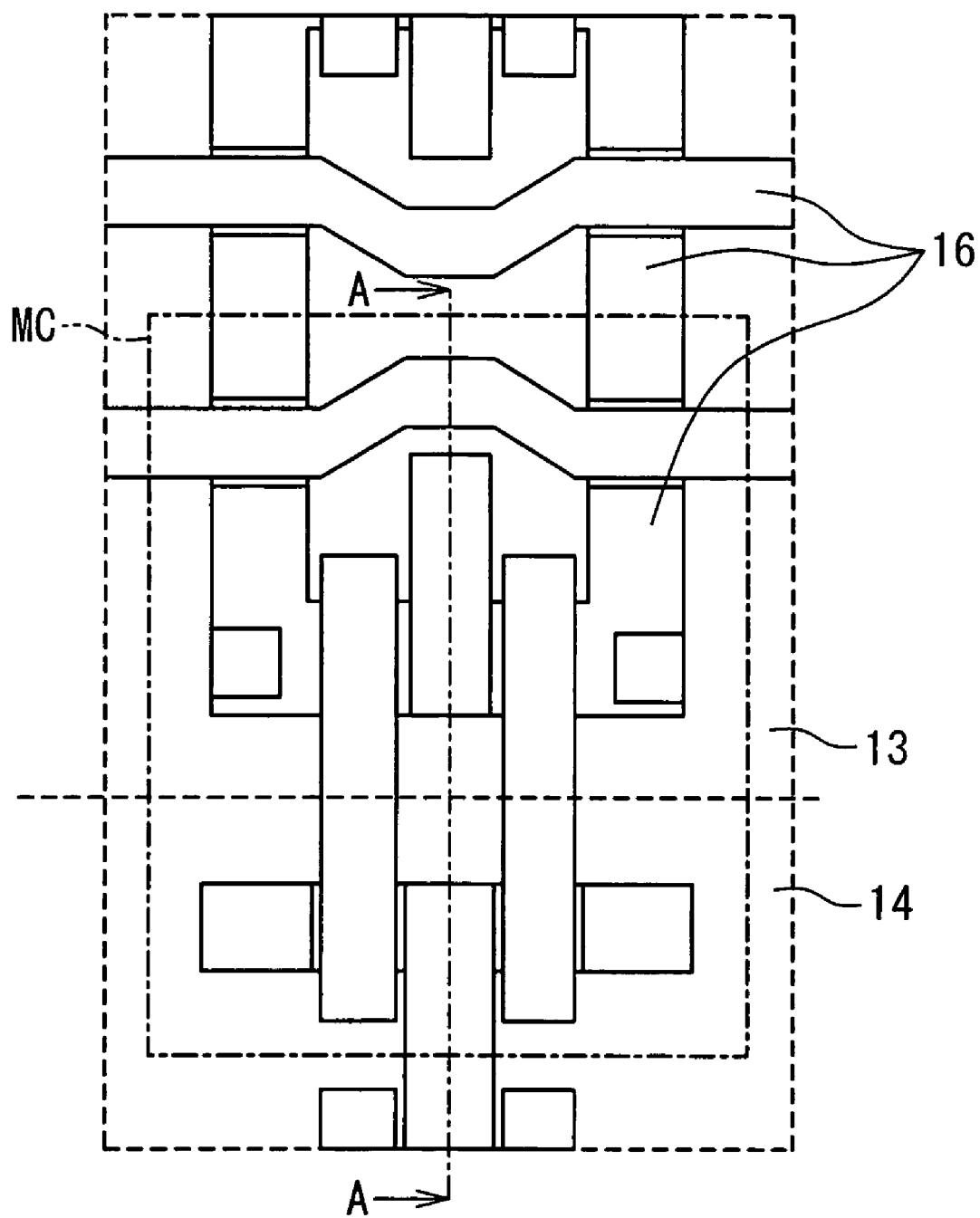
Figure 10B:
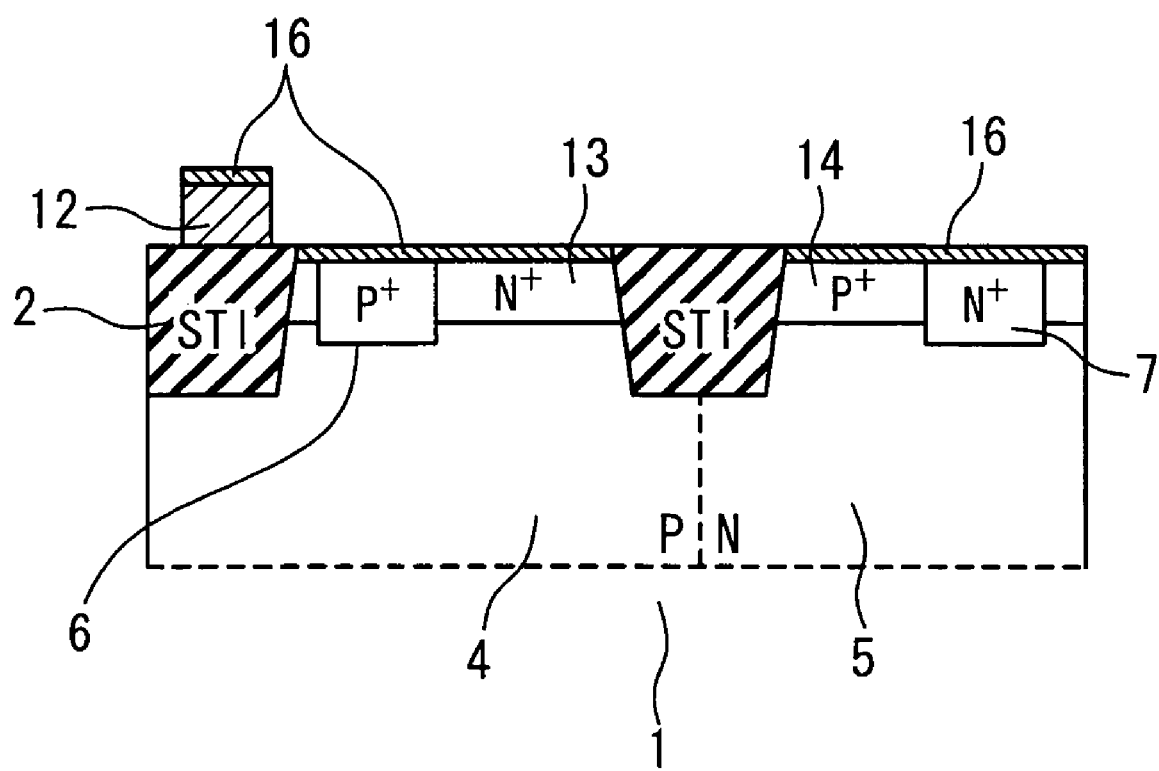

Next, as shown in FIGS. 10A and 10B, the Co salicide layer 16 is formed on the high concentration P-type ground potential region 6, the high concentration N-type power supply potential region 7, the gate interconnection 12, the high concentration N-type source/drain region 13, and the high concentration P-type source/drain region 14. This Co salicide layer 16 is formed in a self-alignment by forming a Co film on the whole surface of the substrate 1 by a sputtering method and by carrying out heat treatment such that the high concentration P-type ground potential region 6, the high concentration N-type power supply potential region 7, the gate interconnection 12, the high concentration N-type source/drain region 13, and the high concentration P-type source/drain region 14 react with Co. An un-reacting Co film is selectively removed by a wet etching.

Figure 11A:
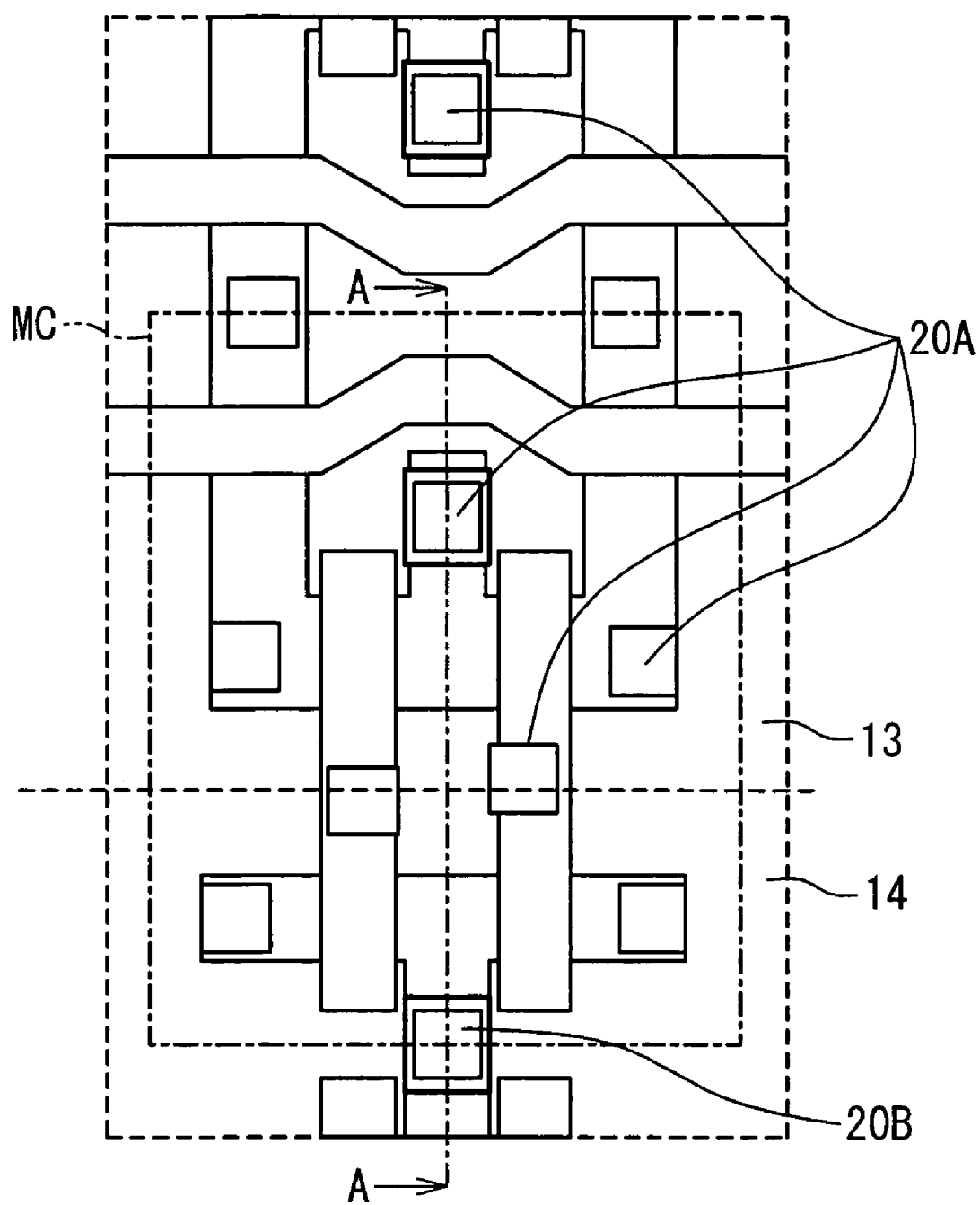
Figure 11B:
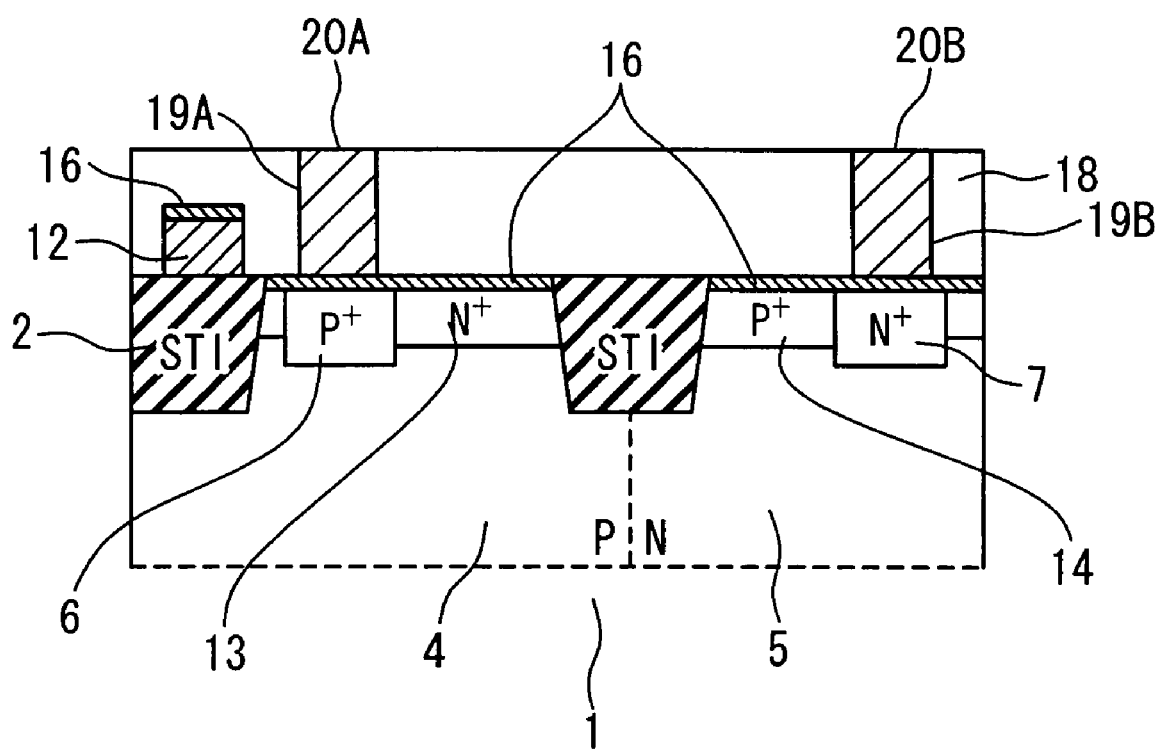

Next, as shown in FIGS. 11A and 11B, the interlayer insulating film 18 of $SiO_2$ is formed on the whole surface by the CVD method, and then the contact holes 19A and 19B are formed in the interlayer insulating film 18 by the photolithography method to expose a part of the Co salicide layer 16 on the P-type well region 4 and the N-type well region 5, respectively. Subsequently, W is embedded in the contact holes 19A and 19B by the CVD method to form contacts 20A and 20B, respectively.

Figure 12A:
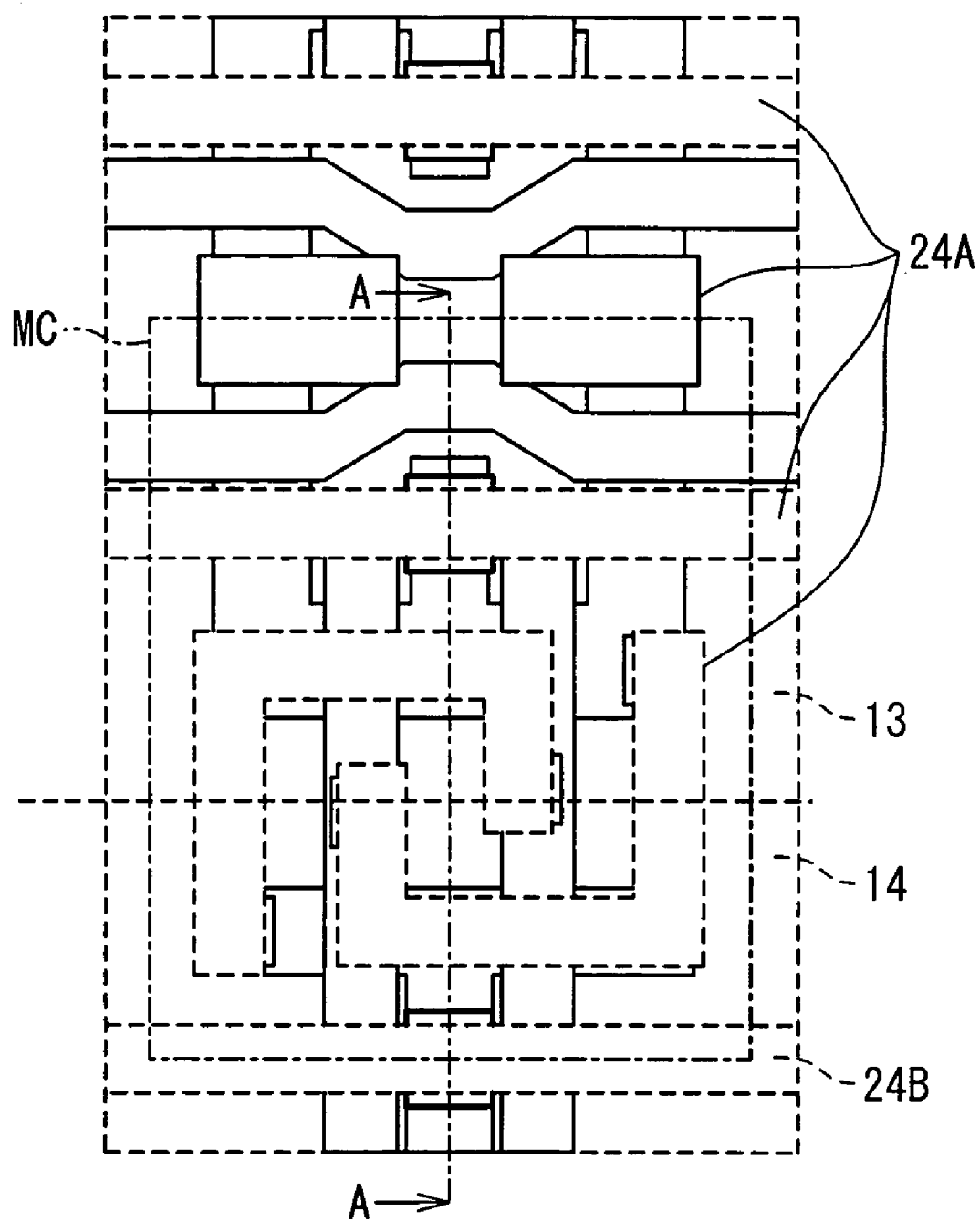
Figure 12B:
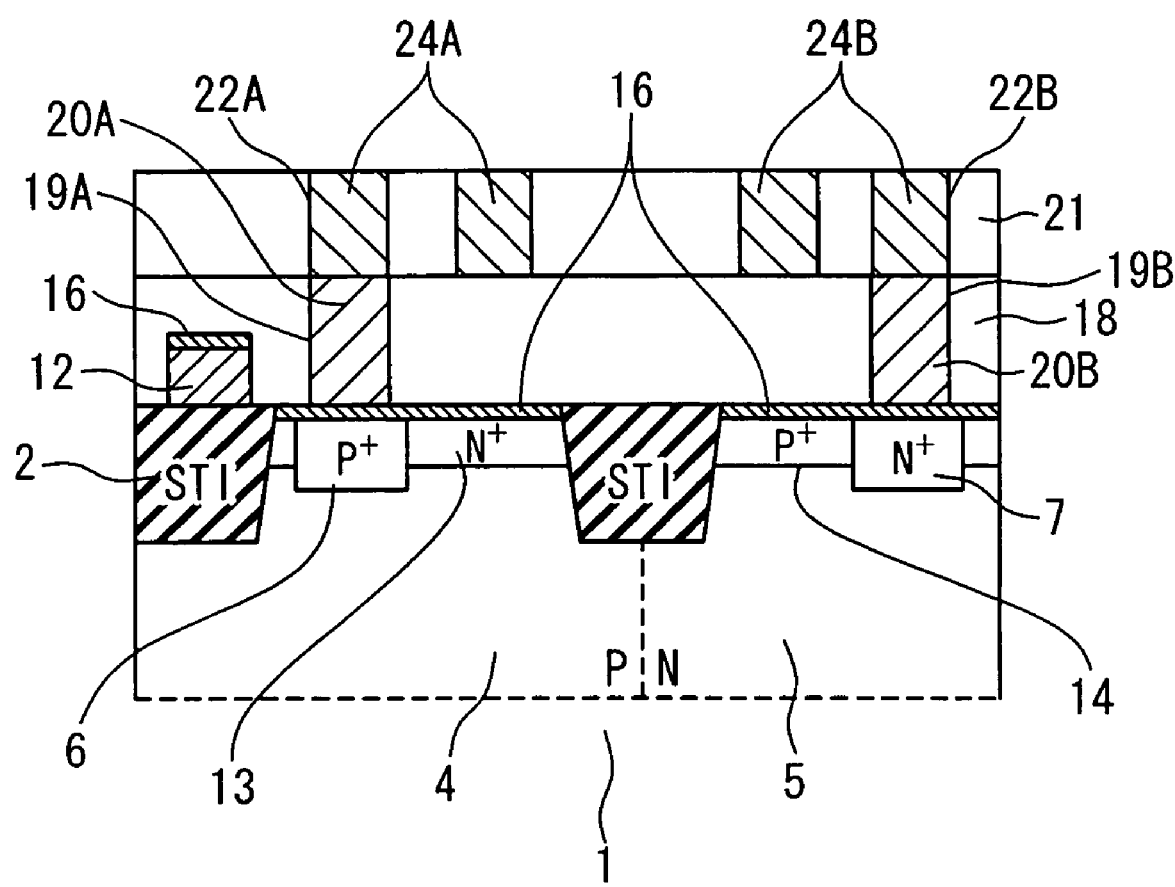

Next, as shown in FIGS. 12A and 12b, the interlayer insulating film 21 of SiOs is formed on the whole surface by the CVD method, and then the contact holes 22A and 22B are formed in the interlayer insulating film 21 by the photolithography method, to expose the contacts 20A and 20B on the P-type well region 4 and the N-type well region 5, respectively. Subsequently, W is embedded in the contact holes 22A and 22B by the CVD method, respectively, to form the ground potential VSS pad interconnection 24A and the power supply potential VDD pad interconnection 24B.

Figure 13A:
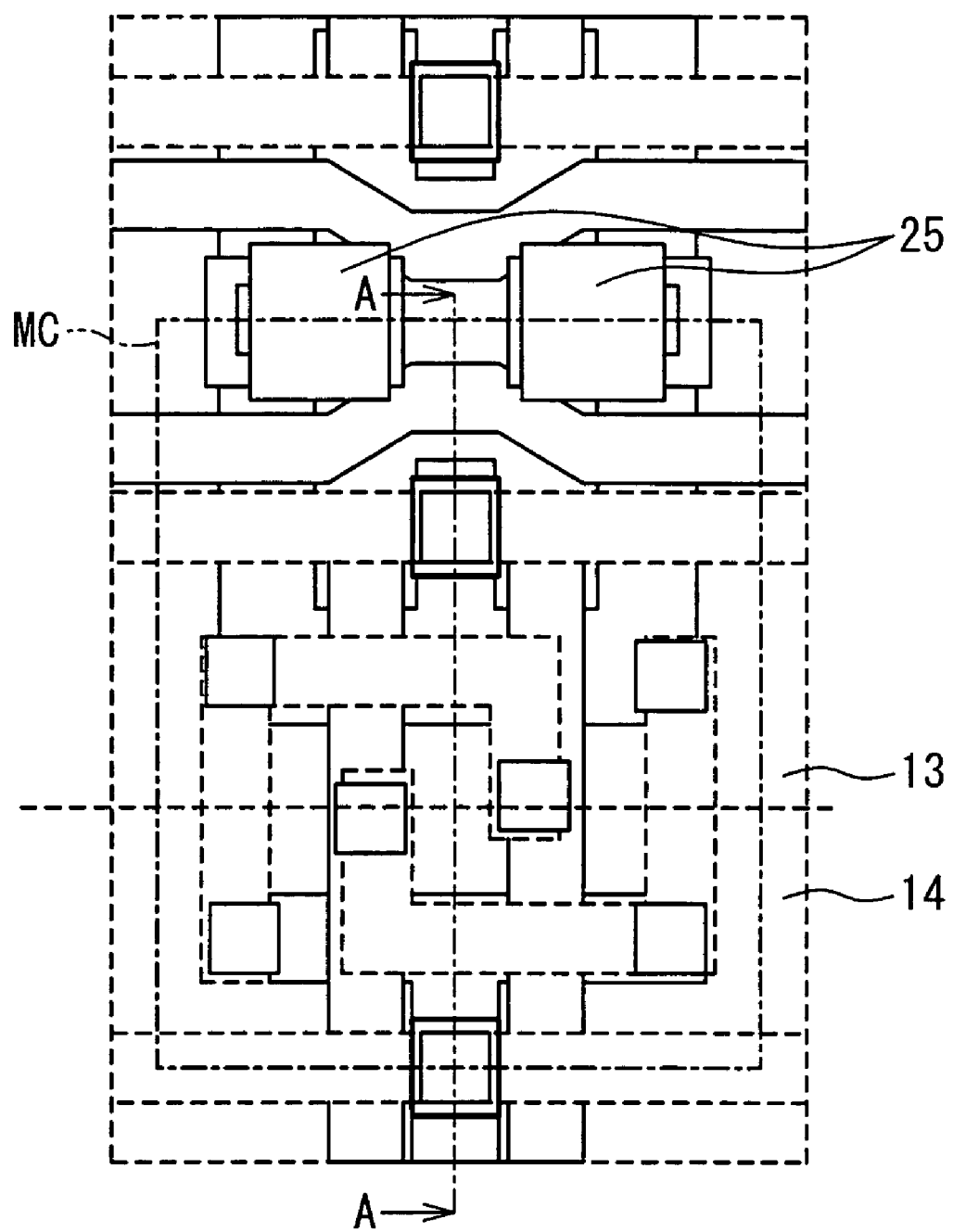
Figure 13B:
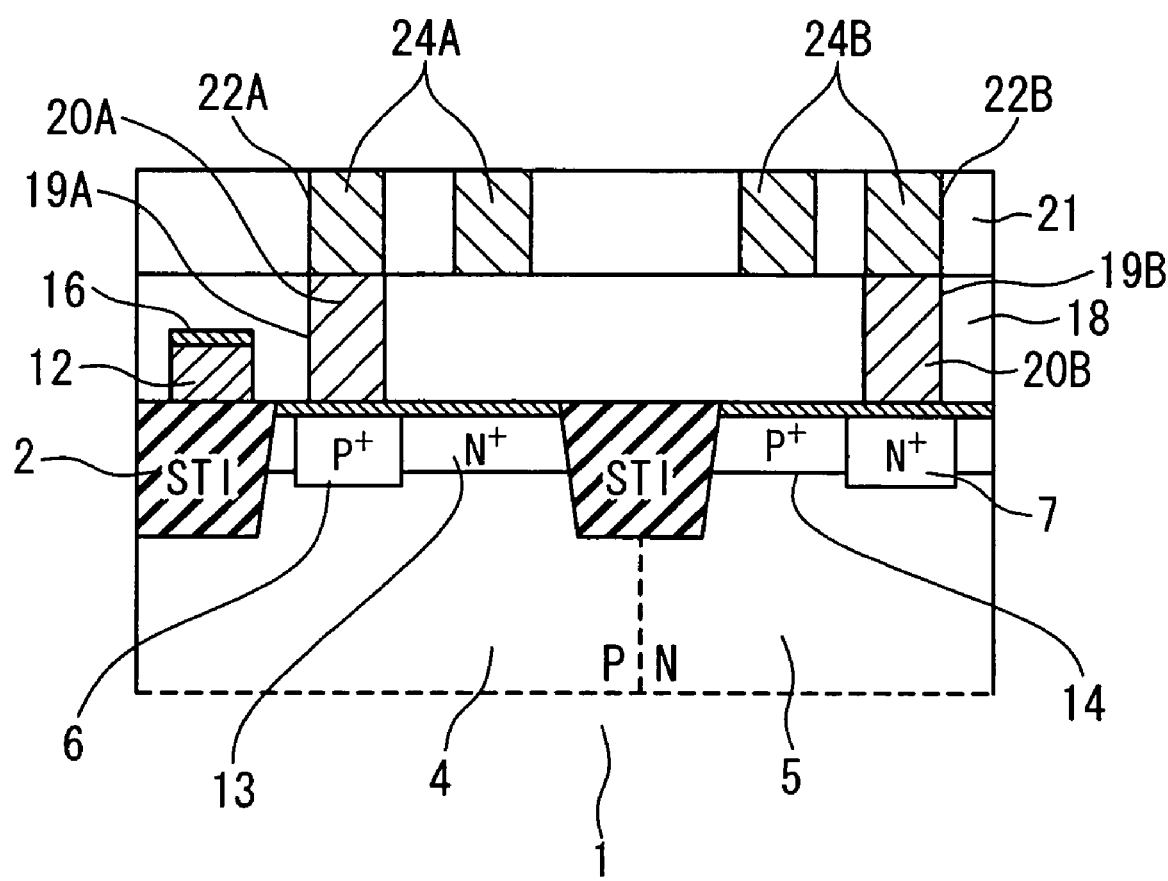

Next, as shown in FIGS. 13A and 13B, the via-interconnections 25 are formed on the respective pad interconnections 24A and 24B. Subsequently, as shown in FIGS. 14A and 14B, the bit lines 26 and 27 are formed on the via-interconnections 25. It should be noted that a multi-layer interconnection of an optional number of layers may be formed by depositing interlayer insulating films and forming the via-interconnections in each of the interlayer insulating films, according to necessity. When the multi-layer interconnection is formed in this way, the bit lines 26 and 27 are formed in the uppermost layer. By carrying out the above steps, the semiconductor memory device 10 in this embodiment is formed, as shown in FIGS. 4 and 5.

In this way, according to the semiconductor memory device 10 in the first embodiment, the high concentration P-type ground potential region 6 is formed in the high concentration N-type source/drain region 13 which is formed in the P-type well region 4, to pass through the source/drain region 13 to the P-type well region 4. Also, the high concentration N-type power supply potential region 7 is formed in the high concentration P-type source/drain region 14 which is formed the N-type well region 5, to pass through the high concentration P-type source/drain region 14 to the N-type well region 5. The ground potential VSS is connected with the high concentration P-type ground potential region 6 through the Co salicide layer 16, the contacts 20A and the ground potential VSS pad interconnection 24A. On the other hand, the power supply potential VDD is connected with the high concentration N-type power supply potential region 7 through the Co salicide layer 16, the contact 20B, and the power supply potential VDD pad interconnection 24B. Therefore, many components such as the plugs and the interconnections become unnecessary unlike the conventional examples. The N-type well contact region which is connected with the power supply potential VDD, i.e., the high concentration N-type power supply potential region 7, and the P-type well contact region which is connected with the ground potential VSS, i.e., the high concentration P-type ground potential region 6 can be formed for every bit of the memory cell MC.

Also, according to the manufacturing method of the semiconductor memory device of this embodiment, by combining the well-known processes, the above-mentioned semiconductor memory device can be manufactured without being accompanied by the cost up. Therefore, the latch-up endurance can be improved without increasing a memory cell array chip region.

Next, with reference to FIGS. 15 and 16, the manufacturing method according to the second embodiment of the semiconductor memory device will be described.

The process shown in FIGS. 8A and 8B is omitted from the manufacturing method in the first embodiment. After the process shown in FIGS. 9A and 9B, the interlayer insulating film 18 of SiO$_2$ is formed on the whole surface by the CVD method, as shown in FIG. 15. Then, the contact holes 19A and 19B are formed in the interlayer insulating film 18 by the photolithography method to expose a part of the Co salicide layer 16 on each of the P-type well region 4 and the N-type well region 5.

Next, as shown in FIG. 13, the P-type impurity such as B is selectively introduced into the P-type well region 4 through the contact hole 19A, to form the high concentration P-type ground potential region 6 deeper than the high concentration P-type source/drain region 14. Also, the N-type impurity such as P or As is selectively introduced into the with the N-type well region 5 through the contact hole 19B, to form the high concentration N-type power supply potential region 7 deeper than the high concentration N-type source/drain region 13. Next, W is filled in the contact holes 19A and 19B by the CVD method to form the contacts 20A and 20B. Thereafter, the process shown in FIGS. 12A and 12B and the subsequent processes of the manufacturing method in the first embodiment are carried out to complete the semiconductor memory device 10, like the first manufacturing method.

According to the manufacturing method in the second embodiment, when the high concentration P-type ground potential region 6 and the high concentration N-type power supply potential region 7 are formed by using the interlayer insulating film 18 as a selection mask for the impurity implantation, the impurity is implanted after forming of the contact holes 19A and 19B. Therefore, even if the selection mask for the impurity introduction is displaced from the active region or the gate interconnection 12, the high concentration P-type ground potential region 6 and the high concentration N-type power supply potential region 7 are not shifted with respect to the bottoms of the contact holes 19a and 19B, and each of the regions 6 and 7 can be formed in the high positioning precision.

In this way, even by the manufacturing method of this semiconductor memory device in the second embodiment, the semiconductor memory device can be manufactured in the same way as the first manufacturing method.

The embodiments of the present invention are described in detail with reference to the drawings. The specific structure of the semiconductor memory device is not limited to the embodiments and any modification may be carried out in a range of the scope of the present invention. Such a modification is contained in the present invention. For example, in the above embodiments, the CMOS type SRAM is formed the MOS-type transistors, but the present invention is never limited to the MOS-type transistors. That is, the gate insulating film is not limited to an oxide film (Oxide) but may be a nitride film, or may be a double film of an oxide film and a nitride film. In other words, the transistor is enough to be an MIS-type transistor and is not limited to the MOS-type transistor. The transistor may be an MNS (Metal Nitride Semiconductor) type transistor or an MNOS (Metal Nitride Oxide Semiconductor) type transistor. Also, the example is shown in which the Co salicide layer is formed. However, the layer is not limited to the Co salicide layer but may be a Ti (titanium) salicide layer. In this case, the same excellent effect as in the Co salicide layer can be achieved. Also, in the manufacturing method of the semiconductor memory device of the embodiments, the example is described in which for the high concentration P-type ground potential semiconductor region and the high concentration N-type power supply potential semiconductor region are formed and then the high concentration P-type source/drain region and the high concentration N-type source/drain region are formed. However, if each of the semiconductor regions is canceled by the source/drain region, the high concentration P-type source/drain region and the high concentration N-type source/drain region may be formed earlier.

According to the semiconductor memory device of the present invention, a pair of MIS-type transistors of the second conductive type are formed in the well region of the first conductive type. Also, a pair of MIS-type transistors of the first conductive type are formed in the well region of the second conductive type. The power supply potential is connected with the well region of the said first conductive type, and the ground potential is connected with the well region of the said second conductive type. Thus, the latch-up endurance can be improved without increasing a memory cell array chip region. Also, according to the manufacturing method of the semiconductor memory device of the present invention, by combining the well-known processes, the semiconductor memory device can be manufactured without being accompanied by the cost up.

As described above, a semiconductor memory device is form by forming in a semiconductor region or substrate, a first well region of a first conductive type and a second well region of a second conductive type which are adjacent to each other, by forming a first semiconductor region of the first conductive type in the first well region, by forming a second semiconductor region of the second conductive type in the second well region, by forming a first source/drain region of the second conductive type around of the first semiconductor region in the first well region for a pair of first MIS-type transistors of the first conductive type, and by forming a second source/drain region of the first conductive type around the second semiconductor region in the second well region for a pair of second MIS-type transistors of the second conductive type.

Otherwise, a semiconductor memory device is form by forming in a semiconductor region or substrate, a first well region of a first conductive type and a second well region of a second conductive type which are adjacent to each other, by forming a first source/drain region of the second conductive type in the first well region for a pair of first MIS-type transistors of the first conductive type, by forming a second source/drain region of the first conductive type in the second well region for a pair of second MIS-type transistors of the second conductive type, by forming a first semiconductor region of the first conductive type in the first source/drain region, by forming a second semiconductor region of the second conductive type in the second source/drain region.

The first semiconductor region is formed to pass through the first source/drain region to the first well region, and the second semiconductor region is formed to pass through the second source/drain region to the second well region.

the first well region is connected with a power supply potential through the first semiconductor region, and the second well region is connected with a ground potential through the second semiconductor region.

The first conductive type is a P conductive type and the second conductive type is an N conductive type.

A first salicide layer is formed in common to a surface of the first source/drain region and a surface of the first semiconductor region, and a second salicide layer is formed in common to a surface of the second source/drain region and a surface of the second semiconductor region. Each of the first and second salicide layers is one of Co salicide layer and a Ti salicide layer. The first salicide layer is connected with the power supply potential and the second salicide layer is connected with the ground potential.

One of the pair of first MIS-type transistors and one of the pair of second MIS-type transistors are connected to constitute a first inverter, and the other of the pair of first MIS-type transistors and the other of the pair of second MIS-type transistors are connected to constitute a second inverter, and gates of MIS-type transistors of one of the first and second inverters are connected with drains of the MIS-type transistors as an output of the other.

First and second contacts are formed to be connected with the first and second semiconductor regions, respectively. The first contact is formed between the first MIS-type transistors and between the pair of first MIS-type transistors and the word line, and the second contact is formed between the second MIS-type transistors and on a side opposite to the pair of first MIS-type transistors.

What is claimed is:

1. A semiconductor memory device comprising:
   a first source/drain region of a first conductive type formed in a first well region of a second conductive type for a pair of first MIS-type transistors of the first conductive type;
   a second source/drain region of the second conductive type formed in a second well region of the first conductive type for a pair of second MIS-type transistors of the second conductive type;
   a first semiconductor region of the second conductive type formed in said first source/drain region; and
   a second semiconductor region of the first conductive type formed in said second source/drain region.

2. The semiconductor memory device according to claim 1, wherein said first semiconductor region is formed to pass through said first source/drain region to said first well region, and
   said second semiconductor region is formed to pass through said second source/drain region to said second well region.

3. The semiconductor memory device according to claim 1, wherein said first well region is connected with a power supply potential, and said second well region is connected with a ground potential.

4. The semiconductor memory device according to claim 1, wherein the first conductive type is an N conductive type and the second conductive type is a P conductive type.

5. The semiconductor memory device according to claim 1, further comprising:
   a first salicide layer formed in common to a surface of said first source/drain region and a surface of said first semiconductor region; and
   a second salicide layer formed in common to a surface of said second source/drain region and a surface of said second semiconductor region.

6. The semiconductor memory device according to claim 5, wherein each of said first and second salicide layers is one of Co salicide layer and a Ti salicide layer.

7. The semiconductor memory device according to claim 5, wherein said first salicide layer is connected with a power supply potential and said second salicide layer is connected with a ground potential.

8. The semiconductor memory device according to claim 1, wherein one of said pair of first MIS-type transistors and one of said pair of second MIS-type transistors are connected to constitute a first inverter, and the other of said pair of first MIS-type transistors and the other of said pair of second MIS-type transistors are connected to constitute a second inverter, and
   an input of one of said first and second inverters is connected with an output of the other.

9. The semiconductor memory device according to claim 8, further comprising:
   a pair of third MIS-type transistors of the first conductive type formed in said first well region,
   one of said pair of third MIS-type transistors has a gate connected with a word line, a source connected with one of a pair of bit lines, and a drain connected with the input of one of said first and second inverters and the output of the other, and
   the other of said pair of third MIS-type transistors has a gate connected with the word line, a source connected with the other of a pair of bit lines, and a drain connected with the output of said one of said first and second inverters and the input of the other.

10. The semiconductor memory device according to claim 9, further comprising:
    first and second contacts connected with said first and second semiconductor regions, respectively,
    wherein said first contact is formed between said first MIS-type transistors and between said pair of first MIS-type transistors and said word line, and
    said second contact is formed between said second MIS-type transistors and on a side opposite to said pair of first MIS-type transistors.

11. A semiconductor memory device comprising:
    a first source/drain region of a first conductive type formed in a first well region of a second conductive type and having first and second portions;
    a second source/drain region of the second conductive type formed in a second well region of the first conductive type and having third, fourth and fifth portions;
    two gate lines extending above said first and second source/drain regions such that said second portion and said fifth portion are between said two gate lines and said two gate lines cross said first and third portions,
    wherein a portion of said first source/drain region under said two gate lines is the second conductive type and a portion of said second source/drain region under said two gate lines is the first conductive type, and said two gate lines and said third portion constitute a pair of first MIS-type transistors, and said two gate lines and said first portion constitute a pair of second MIS-type transistors, a first semiconductor region of the second conductive type formed in said second portion of said first source/drain region; and a second semiconductor region of the first conductive type formed in said fifth portion of said second source/drain region.

12. The semiconductor memory device according to claim 11, wherein said first semiconductor region is formed to pass through said first source/drain region to said first well region, and said second semiconductor region is formed to pass through said second source/drain region to said second well region.

* * * * *